US012575122B2

(12) United States Patent
Li et al.

(10) Patent No.: US 12,575,122 B2
(45) Date of Patent: Mar. 10, 2026

(54) FIN-BASED FIELD EFFECT TRANSISTOR (FET) SOURCE/DRAIN STRAIN TO ENHANCE DRIVER CURRENT AND PERFORMANCE

(71) Applicant: QUALCOMM Incorporated, San Diego, CA (US)

(72) Inventors: Xia Li, San Diego, CA (US); Kwanyong Lim, San Diego, CA (US); Haining Yang, San Diego, CA (US); Biswa Ranjan Panda, Bangaluru (IN); Ramesh Manchana, Hyderabad (IN)

(73) Assignee: QUALCOMM INCORPORATED, San Diego, CA (US)

( * ) Notice: Subject to any disclaimer, the term of this patent is extended or adjusted under 35 U.S.C. 154(b) by 415 days.

(21) Appl. No.: 18/334,301

(22) Filed: Jun. 13, 2023

(65) Prior Publication Data

US 2024/0421214 A1 Dec. 19, 2024

(51) Int. Cl.
H01L 29/66 (2006.01)
H01L 21/8238 (2006.01)
(Continued)

(52) U.S. Cl.
CPC ......... H10D 30/024 (2025.01); H10D 30/014 (2025.01); H10D 30/43 (2025.01); H10D 30/6211 (2025.01); H10D 30/6219 (2025.01); H10D 30/6735 (2025.01); H10D 30/6757 (2025.01); H10D 62/121 (2025.01); H10D 64/017 (2025.01); H10D 84/0167 (2025.01); H10D 84/017 (2025.01);
(Continued)

(58) Field of Classification Search
CPC .... H10D 30/014; H10D 30/024; H10D 30/43; H10D 30/62; H10D 30/6211; H10D 30/6212; H10D 30/6213; H10D 30/6219; H10D 30/6713; H10D 30/6735; H10D 30/6757; H10D 30/797; H10D 62/021; H10D 62/118; H10D 62/119; H10D 62/121; H10D 62/149; H10D 62/151; H10D 64/017; H10D 84/013; H10D 84/0158; H10D 84/017; H10D 84/0193; H10D 84/834; H10D 84/853
See application file for complete search history.

(56) References Cited

U.S. PATENT DOCUMENTS 11,575,044 B2 * 2/2023 Bae ...................... H10D 84/853
2021/0376101 A1 * 12/2021 Wang ................... H10D 62/151
(Continued)

OTHER PUBLICATIONS

Partial International Search Report—PCT/US2024/027096—ISA/EPO—Jul. 10, 2024.
(Continued)

*Primary Examiner* — David C Spalla
(74) *Attorney, Agent, or Firm* — Seyfarth Shaw LLP

(57) ABSTRACT

A field effect transistor (FET) is described. The FET includes a substrate, having a first vertical structure on the substrate, including a source/drain region having a first stressor material. The FET also includes a second vertical structure on the substrate and including a drain/source region having a second stressor material different from the first stressor material. The FET further includes a metal gate on the first vertical structure and on the second vertical structure.

14 Claims, 28 Drawing Sheets

(51) Int. Cl.

| | |
|---|---|
| *H01L 27/092* | (2006.01) |
| *H01L 29/06* | (2006.01) |
| *H01L 29/417* | (2006.01) |
| *H01L 29/423* | (2006.01) |
| *H01L 29/775* | (2006.01) |
| *H01L 29/78* | (2006.01) |
| *H01L 29/786* | (2006.01) |
| *H10D 30/01* | (2025.01) |
| *H10D 30/43* | (2025.01) |
| *H10D 30/62* | (2025.01) |
| *H10D 30/67* | (2025.01) |
| *H10D 62/10* | (2025.01) |
| *H10D 64/01* | (2025.01) |
| *H10D 84/01* | (2025.01) |
| *H10D 84/03* | (2025.01) |
| *H10D 84/85* | (2025.01) |

(52) U.S. Cl.
CPC ....... *H10D 84/0193* (2025.01); *H10D 84/038* (2025.01); *H10D 84/853* (2025.01)

(56) References Cited

U.S. PATENT DOCUMENTS

| | | | |
|---|---|---|---|
| 2022/0165885 A1* | 5/2022 | Liao ..................... | H10D 64/017 |
| 2023/0081783 A1* | 3/2023 | Kim ....................... | H10D 84/85 |
| | | | 257/351 |
| 2023/0115743 A1 | 4/2023 | Lee et al. | |

OTHER PUBLICATIONS

International Search Report and Written Opinion—PCT/US2024/027096—ISA/EPO—Sep. 2, 2024.

* cited by examiner

300
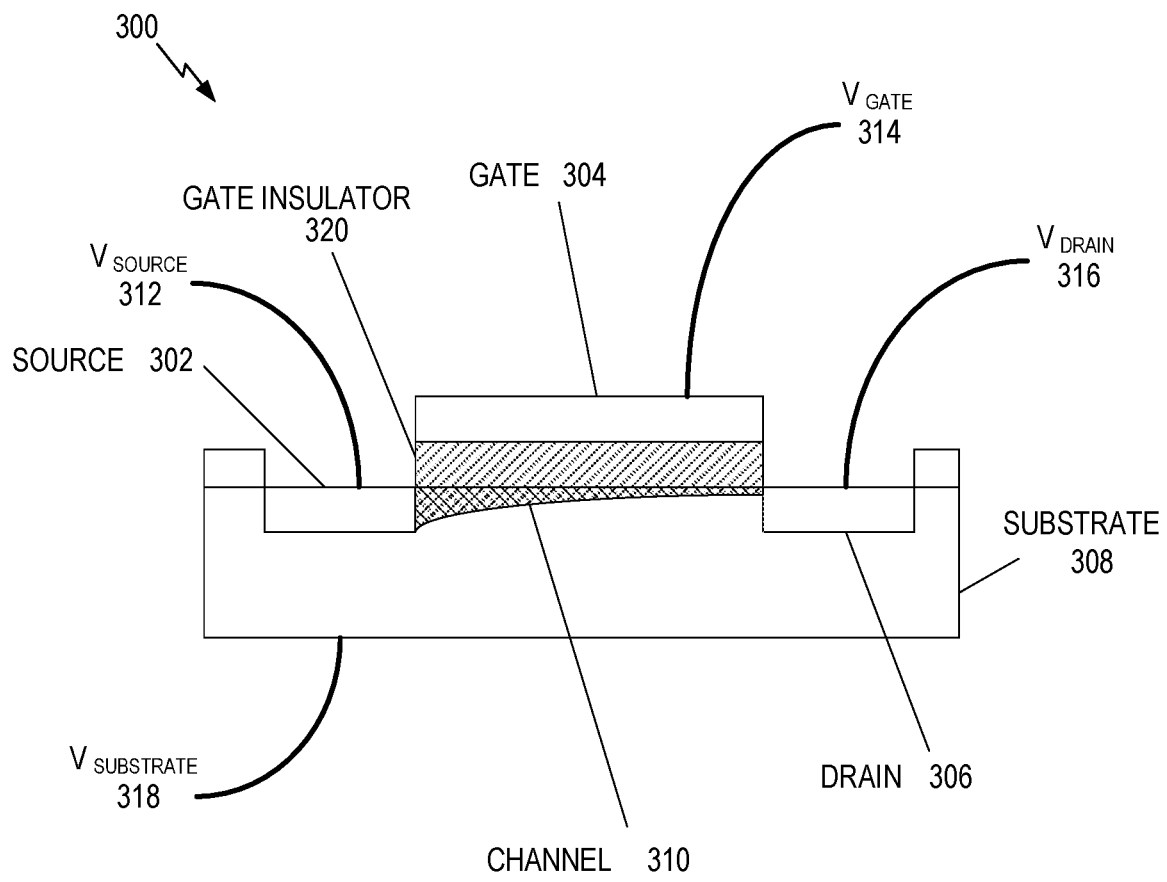
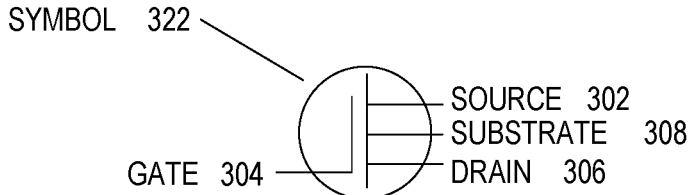
*FIG. 3*

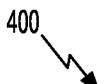
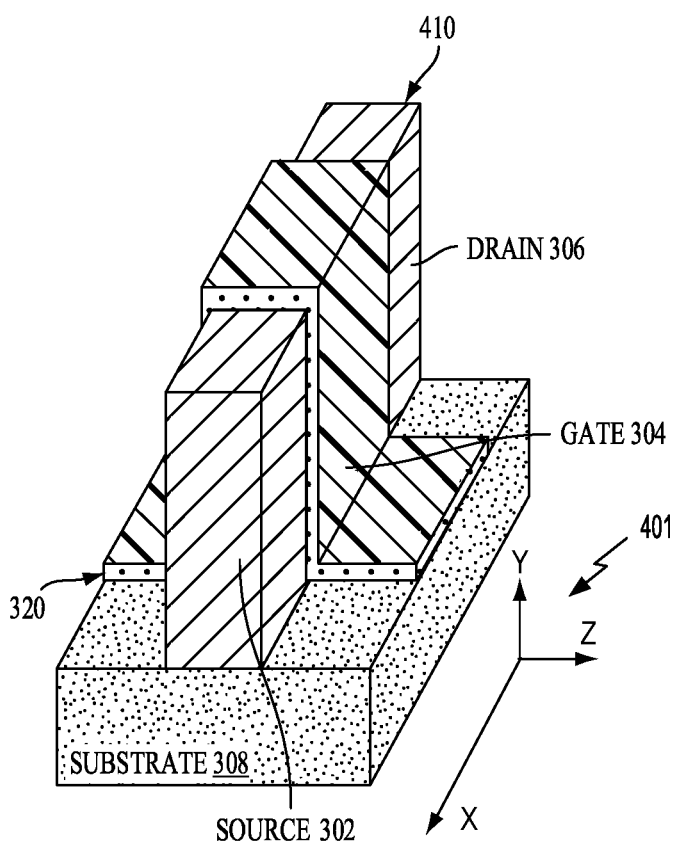
*FIG. 4*

800

(100)

610 {

SEMICONDUCTOR LAYER 609

SEMICONDUCTOR LAYER 607

SEMICONDUCTOR LAYER 605

SEMICONDUCTOR BASE LAYER 604

SUBSTRATE 602

810

812-1

(100)/<110>

812-2

812-3

610 {

SEMICONDUCTOR LAYER 609

SEMICONDUCTOR LAYER 607

SEMICONDUCTOR LAYER 605

SEMICONDUCTOR BASE LAYER 604

SUBSTRATE 602

860

865

900

(100)

620 {

SEMICONDUCTOR LAYER 609

SEMICONDUCTOR LAYER 607

SEMICONDUCTOR LAYER 605

SEMICONDUCTOR BASE LAYER 604

SUBSTRATE 602

910

912-1

(100)/<110>

912-2

912-3

620 {

SEMICONDUCTOR LAYER 609

SEMICONDUCTOR LAYER 607

SEMICONDUCTOR LAYER 605

SEMICONDUCTOR BASE LAYER 604

SUBSTRATE 602

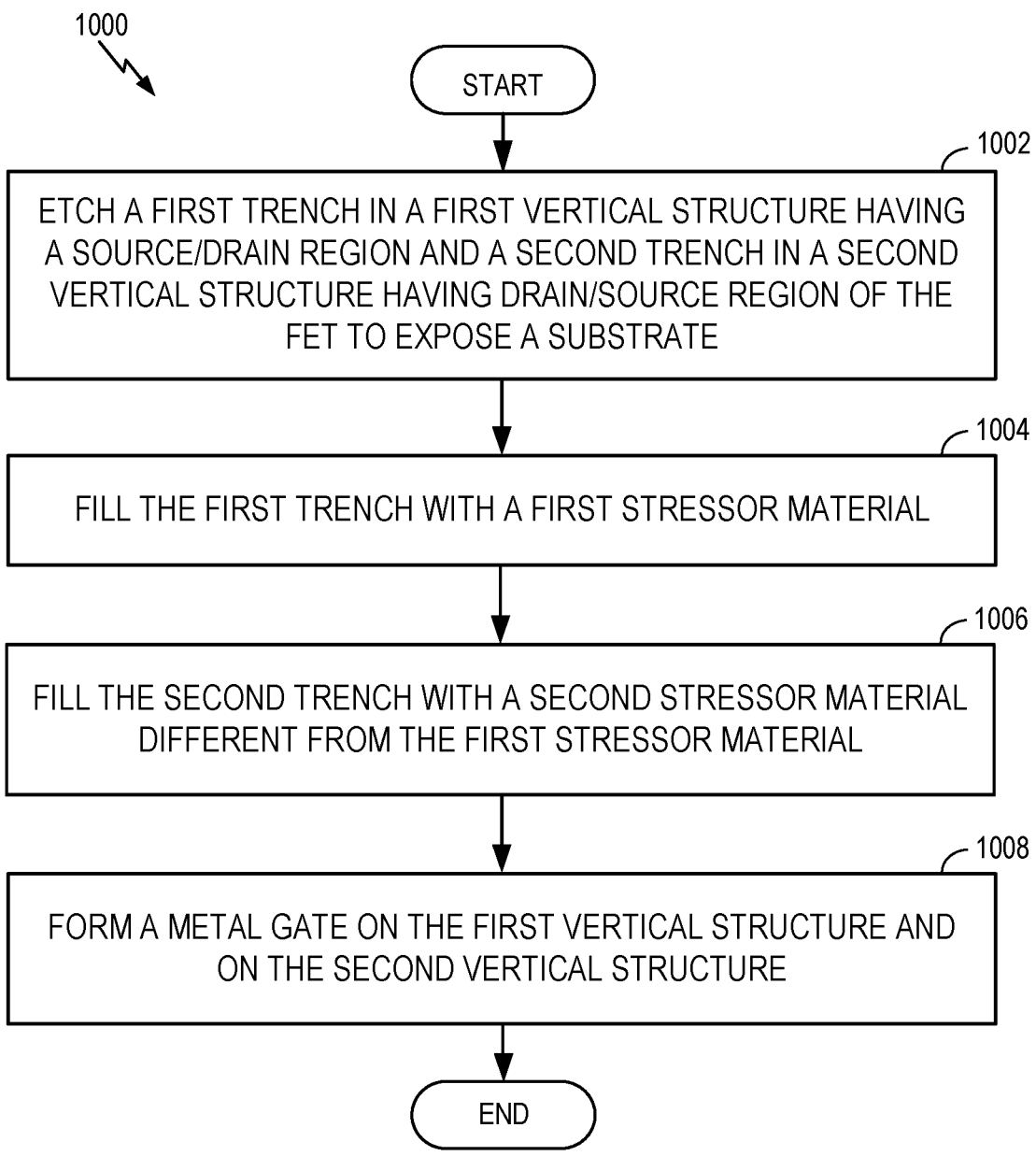

1000

START

1002
ETCH A FIRST TRENCH IN A FIRST VERTICAL STRUCTURE HAVING A SOURCE/DRAIN REGION AND A SECOND TRENCH IN A SECOND VERTICAL STRUCTURE HAVING DRAIN/SOURCE REGION OF THE FET TO EXPOSE A SUBSTRATE

1004
FILL THE FIRST TRENCH WITH A FIRST STRESSOR MATERIAL

1006
FILL THE SECOND TRENCH WITH A SECOND STRESSOR MATERIAL DIFFERENT FROM THE FIRST STRESSOR MATERIAL

1008
FORM A METAL GATE ON THE FIRST VERTICAL STRUCTURE AND ON THE SECOND VERTICAL STRUCTURE

END

*FIG. 10*

FIN-BASED FIELD EFFECT TRANSISTOR (FET) SOURCE/DRAIN STRAIN TO ENHANCE DRIVER CURRENT AND PERFORMANCE

BACKGROUND

Field

Aspects of the present disclosure relate to semiconductor devices and, more particularly, to a fin-based field effect transistor (FET) source/drain strain to enhance driver current and performance.

Background

As integrated circuit (IC) technology advances, device geometries are reduced. Technological advances in IC materials and design have produced generations of ICs in which each generation has smaller and more complex circuits than the previous generation. In the course of IC evolution, functional density has increased while geometry size has decreased. This scaling down process provides benefits by increasing production efficiency and lowering associated costs. Such scaling down also increases the complexity of processing and manufacturing ICs. Moreover, realizing these advancements involves similar developments in IC processing and manufacturing.

One advancement implemented as technology nodes shrink, in some IC designs, is the replacement of the polysilicon gate electrode with a metal gate electrode to improve device performance with the decreased feature sizes. Although existing methods of fabricating IC devices are adequate for their intended purposes, they are not entirely satisfactory in all respects. For example, fin-based devices are three-dimensional structures on the surface of a semiconductor substrate. A fin-based field effect transistor (FET) may be referred to as a FinFET.

Advanced logic complementary metal oxide semiconductor (CMOS) scaling for FinFET technologies achieves a performance-power-area (PPA) boost over past process nodes. Unfortunately, further FinFET transistor mobility in sub-seven nanometer (nm) process nodes is difficult because conventional strain boosters are reaching their limit. Therefore, a new strain booster for continuous FinFET device performance improvement is desired.

SUMMARY

A field effect transistor (FET) is described. The FET includes a substrate, having a first vertical structure on the substrate, including a source/drain region having a first stressor material. The FET also includes a second vertical structure on the substrate and including a drain/source region having a second stressor material different from the first stressor material. The FET further includes a metal gate on the first vertical structure and on the second vertical structure.

A method fabricating a field effect transistor (FET) is described. The method includes etching a first trench in a first vertical structure having a source/drain region and a second trench in a second vertical structure having drain/source region of the FET to expose a substrate. The method also includes filling the first trench with a first stressor material. The method further includes filling the second trench with a second stressor material different from the first stressor material. The method also includes forming a metal gate on the first vertical structure and on the second vertical structure.

This has outlined, broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

FIG. 3 illustrates a cross-sectional view of a metal oxide semiconductor field effect transistor (MOSFET) device.

FIG. 4 illustrates a fin-based field effect transistor (FinFET), in which strained source/drain regions may be formed according to various aspects of the present disclosure.

FIG. 10 is a process flow diagram illustrating a method of fabricating a gate all around (GAA) field effect transistor (FET) having strained source and drain regions, according to various aspects of the present disclosure.

DETAILED DESCRIPTION

Figure 1:
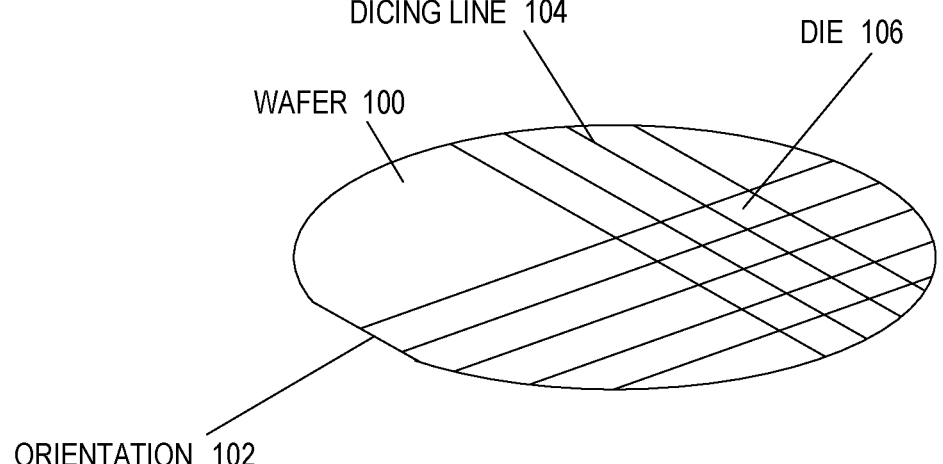
FIG. 1 illustrates a perspective view of a semiconductor wafer.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described herein, the use of the term "and/or" is intended to represent an "inclusive OR," and the use of the term "or" is intended to represent an "exclusive OR." As described herein, the term "exemplary" used throughout this description means "serving as an example, instance, or illustration," and should not necessarily be construed as preferred or advantageous over other exemplary configurations. As described herein, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations.

As integrated circuit (IC) technology advances, device geometries are reduced. Technological advances in IC materials and design have produced generations of ICs in which each generation has smaller and more complex circuits than the previous generation. In the course of IC evolution, functional density has increased while geometry size has decreased. This scaling down process provides benefits by increasing production efficiency and lowering associated costs. Such scaling down has also increased the complexity of processing and manufacturing ICs. Realizing these advancements involves similar developments in IC processing and manufacturing.

Fin-based devices represent a significant advance in IC technology over planar-based devices. Fin-based devices are three-dimensional structures on the surface of a semiconductor substrate. A fin field effect transistor (Fanfest) is a fin-based metal oxide semiconductor field effect transistor (MOSFET). A nanowire field effect transistor (FET) also represents a significant advance in IC technology. A gate-all-around (GAA) nanosheet-based device is another three-dimensional structure on the surface of a semiconductor substrate. Other fin-based devices include omega-gate devices as well as pi-gate devices. A fin-based field effect transistor may be referred to as a FinFET device.

One advancement implemented as technology nodes shrink, in some IC designs, is the replacement of the polysilicon gate electrode with a metal gate electrode to improve device performance with the decreased feature sizes. Although existing methods of fabricating IC devices are adequate for their intended purposes, the methods are not entirely satisfactory in all respects. For example, the fin-based devices may be implemented using replacement metal gate (RMG) technology.

Advanced logic complementary metal oxide semiconductor (CMOS) scaling for fin-based devices implemented with RMG technology achieves a performance-power-area (PPA) boost over past process nodes. Unfortunately, further fin-based transistor mobility in sub-seven nanometer (nm) process nodes is difficult because conventional strain boosters are reaching their limit. Therefore, a new strain booster for continuous fin-based transistor performance improvement is desired.

Various aspects of the present disclosure are directed to fin-based field effect transistors (FETs) having source/drain strains to enhance driver current and performance. The process flow for fabricating the fin-based FET device having strained source and drain regions may include front-end-of-line (FEOL) processes, middle-of-line (MOL) processes, and back-end-of-line (BEOL) processes. It will be understood that the term "layer" includes film and is not to be construed as indicating a vertical or horizontal thickness unless otherwise stated. As described herein, the term "substrate" may refer to a substrate of a diced wafer or may refer to the substrate of a wafer that is not diced. Similarly, the terms "wafer" and "die" may be used interchangeably unless such interchanging would tax credulity.

According to aspects of the present disclosure, a fin-based field effect transistor (FET) having source/drain strains is described. The fin-based FET includes a substrate having a shallow trench isolation (STI) region on the substrate. The fin-based FET also includes a first vertical structure on the substrate and extending through the STI region, and a second vertical structure on the substrate and extending through the STI region. The fin-based FET further includes a metal gate on the STI region, on the first vertical structure, and on the second vertical structure. In some aspects of the present disclosure, the first vertical structure includes a source/drain region composed of a first stressor material, and a second vertical structure includes a drain/source region composed of a second stressor material different from the first stressor material.

FIG. 1 illustrates a perspective view of a semiconductor wafer, which may be used for fabricating a fin-based FET having strained source/drain regions, according to aspects of the present disclosure. A wafer 100 may be a semiconductor wafer or may be a substrate material with one or more layers of semiconductor material on a surface of the wafer 100. When the wafer 100 is a semiconductor material, it may be grown from a seed crystal using the Czochralski process, where the seed crystal is dipped into a molten bath of semiconductor material and slowly rotated and removed from the bath. The molten material then crystalizes onto the seed crystal in the orientation of the crystal.

The wafer 100 may be a single material (e.g., silicon (Si), germanium (Ge)) or a compound material, such as gallium arsenide (GaAs), gallium nitride (GaN), or indium phosphide (InP), a ternary material such as indium gallium arsenide (InGaAs), quaternary materials, or any material that can be a substrate material for other semiconductor materials. Although many of the materials may be crystalline in nature, polycrystalline or amorphous materials may also be used for the wafer 100.

The wafer 100, or layers that are coupled to the wafer 100, may be supplied with materials that make the wafer 100 more conductive. For example, and not by way of limitation, a silicon wafer may have phosphorus or boron added to the wafer 100 to allow for electrical charge to flow in the wafer 100. These additives are referred to as dopants and provide extra charge carriers (either electrons or holes) within the wafer 100 or portions of the wafer 100. By selecting the areas where the extra charge carriers are provided, which type of charge carriers are provided, and the amount (density) of additional charge carriers in the wafer 100, diverse types of electronic devices may be formed in or on the wafer 100.

The wafer 100 has an orientation 102 that indicates the crystalline orientation of the wafer 100. The orientation 102 may be a flat edge of the wafer 100 as shown in FIG. 1 or may be a notch or other indicia to illustrate the crystalline orientation of the wafer 100. The orientation 102 may indicate the Miller Indices for the planes of the crystal lattice in the wafer 100.

The Miller Indices form a notation system of the crystallographic planes in crystal lattices. The lattice planes may be indicated by three integers h, k, and f, which are the Miller indices for a plane (hkl) in the crystal. Each index denotes a plane orthogonal to a direction (h, k, l) on the basis of the reciprocal lattice vectors. The integers are usually written in lowest terms (e.g., their greatest common divisor should be 1). Miller index 100 represents a plane orthogonal to direction h; index 010 represents a plane orthogonal to direction k, and index 001 represents a plane orthogonal to f. For some crystals, negative numbers are used (written as a bar over the index number) and for some crystals, such as gallium nitride, more than three numbers may be employed to describe the different crystallographic planes.

Once the wafer 100 has been processed as desired, the wafer 100 is divided up along dicing lines 104. The dicing lines 104 indicate where the wafer 100 is to be broken apart or separated into pieces. The dicing lines 104 may define the outline of the various integrated circuits that have been fabricated on the wafer 100.

Once the dicing lines 104 are defined, the wafer 100 may be sawn or otherwise separated into pieces to form die 106. Each of the die 106 may be an integrated circuit with many devices or may be a single electronic device. The physical size of the die 106, which may also be referred to as a chip or a semiconductor chip, depends at least in part on the ability to separate the wafer 100 into certain sizes, as well as the number of individual devices that the die 106 is designed to contain.

Once the wafer 100 has been separated into one or more die 106, the die 106 may be mounted into packaging to allow access to the devices and/or integrated circuits fabricated on the die 106. Packaging may include single in-line packaging, dual in-line packaging, motherboard packaging, flip-chip packaging, indium dot/bump packaging, or other types of devices that provide access to the die 106. The die 106 may also be directly accessed through wire bonding, probes, or other connections without mounting the die 106 into a separate package.

Figure 2:
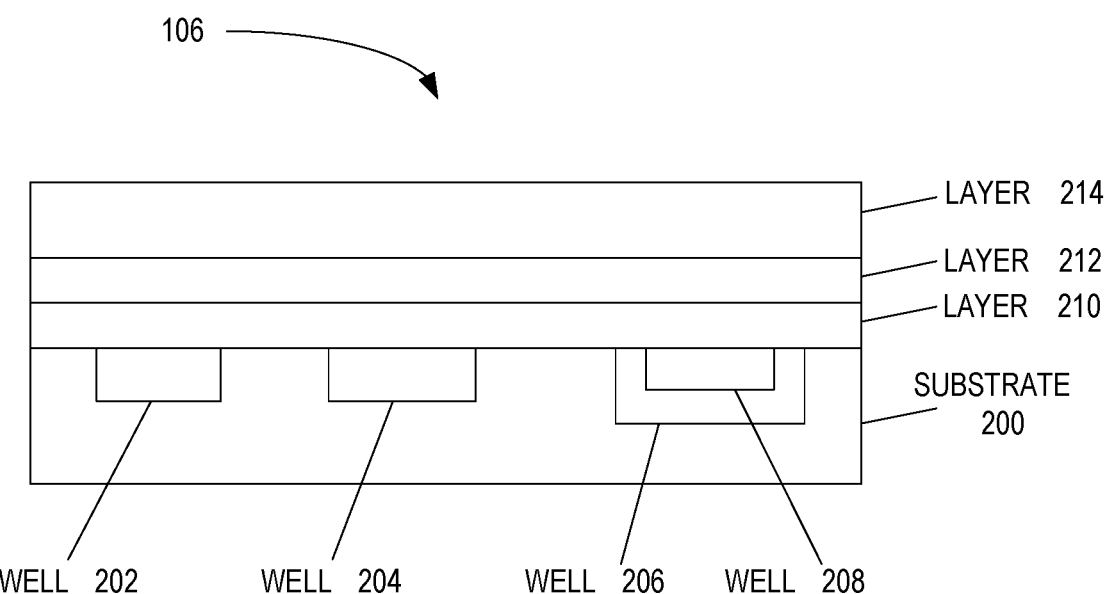
FIG. 2 illustrates a cross-sectional view of a die.

FIG. 2 illustrates a cross-sectional view of the die 106 of FIG. 1, which may be used for fabricating a vertical structure-based FET having strained source/drain regions, according to aspects of the present disclosure. In the die 106, there may be a substrate 200, which may be a semiconductor material and/or may act as a mechanical support for electronic devices. The substrate 200 may be a doped semiconductor substrate, which has either electrons (designated N-type) or holes (designated P-type) charge carriers present throughout the substrate 200. Subsequent doping of the substrate 200 with charge carrier ions/atoms may change the charge carrying capabilities of the substrate 200.

Within the substrate 200 (e.g., a semiconductor substrate), there may be wells 202 and 204 of a field effect transistor (FET), or wells 202 and/or 204 may be for fin structures of a fin structured FET (FinFET). Wells 202 and/or 204 may also be for other devices (e.g., a resistor, a capacitor, a diode, or other electronic devices) depending on the structure and other characteristics of the wells 202 and/or 204 and the surrounding structure of the substrate 200.

The semiconductor substrate may also have a well 206 and a well 208. The well 208 may be completely within the well 206, and, in some cases, may form a bipolar junction transistor (BJT). The well 206 may also be used as an isolation well to isolate the well 208 from electric and/or magnetic fields within the die 106.

Layers (e.g., 210 through 214) may be added to the die 106. The layer 210 may be, for example, an oxide or insulating layer that may isolate the wells (e.g., 202-208) from each other or from other devices on the die 106. In such cases, the layer 210 may be silicon dioxide, a polymer, a dielectric, or another electrically insulating layer. The layer 210 may also embed an interconnection layer, in which case it may comprise a conductive material such as copper, tungsten, aluminum, an alloy, or other conductive or metallic materials.

The layer 212 may also be a dielectric or conductive layer, depending on the desired device characteristics and/or the materials of the layers (e.g., 210 and 214). The layer 214 may be an encapsulating layer, which may protect the layers (e.g., 210 and 212), as well as the wells 202-208 and the substrate 200, from external forces. For example, and not by way of limitation, the layer 214 may be a layer that protects the die 106 from mechanical damage, or the layer 214 may be a layer of material that protects the die 106 from electromagnetic or radiation damage.

Electronic devices designed on the die 106 may comprise many features or structural components. For example, the die 106 may be exposed to any number of methods to impart dopants into the substrate 200, the wells 202-208, and, if desired, the layers (e.g., 210-214). For example, and not by way of limitation, the die 106 may be exposed to ion implantation, deposition of dopant atoms that are driven into a crystalline lattice through a diffusion process, chemical vapor deposition, epitaxial growth, or other methods. Through selective growth, material selection, and removal of portions of the layers (e.g., 210-214), and through selective removal, material selection, and dopant concentration of the substrate 200 and the wells 202-208, many different structures and electronic devices may be formed within the scope of the present disclosure.

Further, the substrate 200, the wells 202-208, and the layers (e.g., 210-214) may be selectively removed or added through various processes. Chemical wet etching, chemical mechanical planarization (CMP), plasma etching, photoresist masking, damascene processes, and other methods may create the structures and devices of the present disclosure.

FIG. 3 illustrates a cross-sectional view of a metal oxide semiconductor field effect transistor (MOSFET) device 300. The MOSFET device 300 may have four input terminals. The four inputs are a source 302, a gate 304, a drain 306, and a body. The source 302 and the drain 306 may be fabricated as the wells 202 and 204 in a substrate 308 or may be fabricated as areas above the substrate 308, or as part of other layers on the die 106. Such other structures may be a fin or other structure that protrudes from a surface of the substrate 308. Further, the substrate 308 may be the substrate 200 on the die 106, but the substrate 308 may also be one or more of the layers (e.g., 210-214) that are coupled to the substrate 200.

The MOSFET device 300 is a unipolar device, as electrical current is produced by only one type of charge carrier (e.g., either electrons or holes) depending on the type of MOSFET. The MOSFET device 300 operates by controlling the amount of charge carriers in the channel 310 between the source 302 and the drain 306. A voltage Vsource 312 is applied to the source 302, a voltage Vgate 314 is applied to the gate 304, and a voltage Vdrain 316 is applied to the drain 306. A separate voltage Vsubstrate 318 may also be applied to the substrate 308, although the voltage Vsubstrate 318 may be coupled to one of the voltage Vsource 312, the voltage Vgate 314, or the voltage Vdrain 316.

To control the charge carriers in the channel 310, the voltage Vgate 314 creates an electric field in the channel 310 when the gate 304 accumulates charges. The opposite charge to that accumulating on the gate 304 begins to inverse charges in the channel 310. The gate insulator 320 insulates the charges accumulating on the gate 304 from the source 302, the drain 306, and the channel 310. The gate 304 and the channel 310, with the gate insulator 320 in between, create a capacitor, and as the voltage Vgate 314 increases, the charge carriers on the gate 304, acting as one plate of this capacitor, begin to accumulate. This accumulation of charges on the gate 304 attracts the opposite charge carriers into the channel 310. Eventually, enough inverse charge carriers are accumulated in the channel 310 to provide an electrically conductive path between the source 302 and the drain 306. This condition may be referred to as opening the channel of the FET.

By changing the voltage Vsource 312 and the voltage Vdrain 316, and their relationship to the voltage Vgate 314, the amount of voltage applied to the gate 304 that opens the channel 310 may vary. For example, in a PMOS FET, the voltage Vsource 312 is usually of a higher potential than that of the voltage Vdrain 316. Making the voltage differential between the voltage Vsource 312 and the voltage Vdrain 316 larger will change the amount of the voltage Vgate 314 used to open the channel 310. Further, a larger voltage differential will change the amount of electromotive force moving charge carriers through the channel 310, creating a larger current through the channel 310.

The gate insulator 320 material may be silicon oxide or may be a dielectric or other material with a different dielectric constant (k) than silicon oxide. Further, the gate insulator 320 may be a combination of materials or different layers of materials. For example, the gate insulator 320 may be Aluminum Oxide, Hafnium Oxide, Hafnium Oxide Nitride, Zirconium Oxide, or laminates and/or alloys of these materials. Other materials for the gate insulator 320 may be used without departing from the scope of the present disclosure.

By changing the material for the gate insulator 320, and the thickness of the gate insulator 320 (e.g., the distance between the gate 304 and the channel 310), the amount of charge on the gate 304 to open the channel 310 may vary. A symbol 322 showing the terminals of the MOSFET device 300 is also illustrated. For N-channel MOSFETs (using electrons as charge carriers in the channel 310), an arrow is applied to the substrate 308 terminal in the symbol 322 pointing away from the gate 304 terminal. For P-type MOSFETs (using holes as charge carriers in the channel 310), an arrow is applied to the substrate 308 terminal in the symbol 322 pointing toward the gate 304 terminal.

In some MOSFET designs, a high-k value material may be desired in the gate insulator 320, and in such designs, other conductive materials may be employed. For example, and not by way of limitation, a "high-k metal gate" design may employ a metal, such as tungsten and work function metal TiN or TiAl, for the gate 304 terminal. Although referred to as "metal," polycrystalline materials, alloys, or other electrically conductive materials are contemplated as appropriate materials for the gate 304, as described below.

To interconnect to the MOSFET device 300, or to interconnect to other devices in the die 106 (e.g., semiconductor), interconnect traces or layers are used. These interconnect traces may be in one or more layers (e.g., 210-214), or may be in other layers of the die 106.

FIG. 4 illustrates a fin-based field effect transistor (FinFET), in which strained source/drain regions may be formed according to aspects of the present disclosure. As shown in FIG. 4, a FinFET 400 operates in a similar fashion to the MOSFET device 300 described with respect to FIG. 3. A fin 410 of the FinFET 400, however, is grown or otherwise coupled to the substrate 308 of FIG. 3. The substrate 308 may be a semiconductor substrate or other like supporting layer, for example, comprised of an oxide layer, a nitride layer, a metal oxide layer, or a silicon layer. The fin 410 includes the source 302 and the drain 306. A gate 304 is disposed on the fin 410 and on the substrate 308 through a gate insulator 320. An XYZ axis 401 of the FinFET 400 is also shown.

Figure 5:
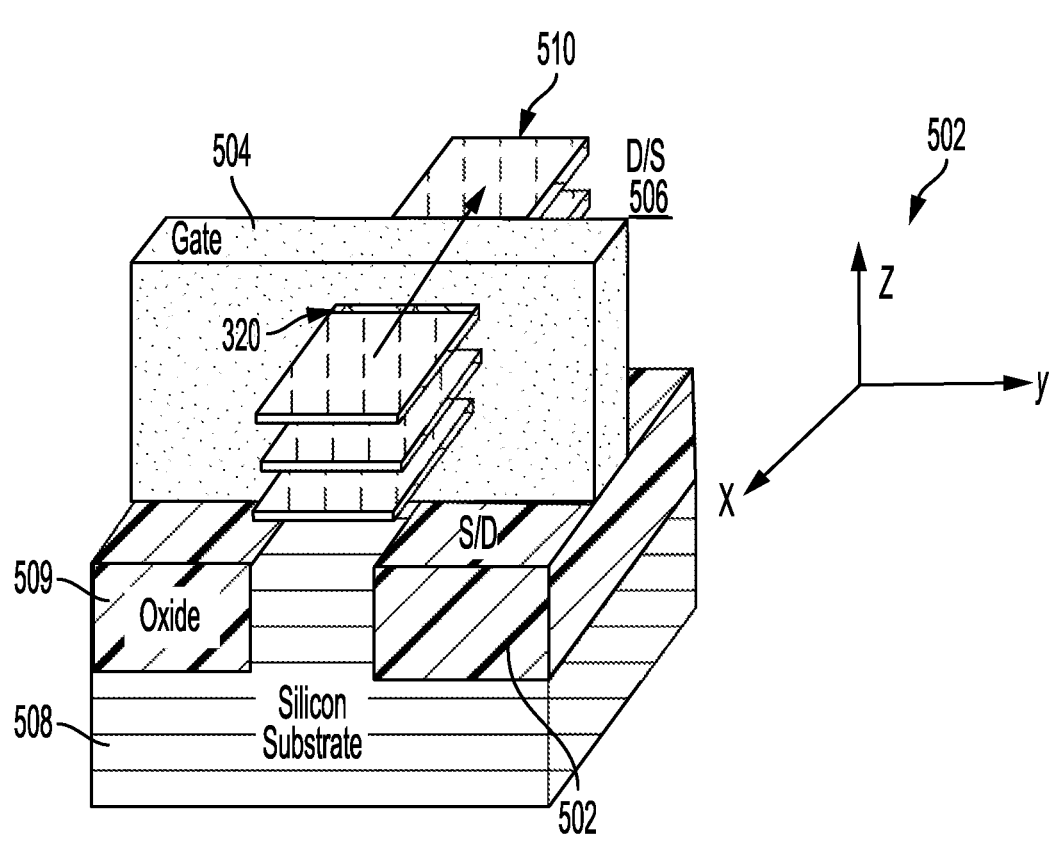
FIG. 5 illustrates a gate all around (GAA) field effect transistor (FET), in which strained source/drain regions may be formed, according to various aspects of the present disclosure.

FIG. 5 illustrates a gate all around (GAA) field effect transistor (FET), in which strained source/drain regions may be formed, according to aspects of the present disclosure. As shown in FIG. 5, a nanosheet 510 of a gate all around (GAA) FET 500 is grown or otherwise coupled to a substrate 508. The substrate 508 may be a semiconductor substrate or other like supporting layer, for example, comprised of an oxide layer, a nitride layer, a metal oxide layer, or a silicon layer. The nanosheet 510 also includes a source 502 and a drain 506. Additionally, a gate 504 is disposed on and surrounds the nanosheet 460 on four sides through a gate insulator 320 to provide first and second channels. The gate 504 is also on the substrate 508. An XYZ axis 501 of the GAA FET 500 is also shown. As illustrated by the XYZ axis 501, the Y and Z axis are swapped in the configuration of the GAA FET 500 relative to the XYZ axis 401 of the FinFET 400 in FIG. 4.

FIGS. 4 and 5 illustrate vertical structure-based field effect transistors (FETs). The vertical structure of the FinFET 400 and the GAA FET 500 facilitates a physical size of the FinFET 400 and the GAA FET 500 that is smaller than the MOSFET device 300 structure shown in FIG. 3. This reduction in the physical size allows for more devices per unit area on the die 106 shown in FIG. 1. The FinFET 400 and the GAA FET 500 may be fabricated through processes including a front-end-of-line (FEOL), a middle-of-line (MOL) and a back-end-of-line (BEOL). An MOL process includes gate and terminal contact formation, which may be referred to as a zero interconnect (MO) layer. An MOL layer trench contacts the source and drain regions of the FinFET 400 and the GAA FET 500 are referred to as metal to diffusion (MD) contacts, including metal to diffusion vias (VD) and gate vias (VG).

Vertical structure-based devices, such as the FinFET 400 and the GAA FET 500, represent a significant advance in integrated circuit (IC) technology over planar-based devices. Vertical structure-based devices are three-dimensional structures on the surface of a semiconductor substrate. A FinFET transistor (e.g., FinFET 400) is a fin-based metal oxide semiconductor field effect transistor (MOSFET). A nanowire FET also represents a significant advance in IC technology. A gate-all-around (GAA) nanosheet-based device (e.g., GAA FET 500) is another three-dimensional structure on the surface of a semiconductor substrate. Other vertical structure-based devices include omega-gate devices as well as pi-gate devices. A vertical structure-based field effect transistor may be referred to as a FinFET device.

One advancement implemented as technology nodes shrink, in some IC designs, is the replacement of the polysilicon gate electrode with a metal gate electrode to improve device performance with the decreased feature sizes. Although existing methods of fabricating IC devices are adequate for their intended purposes, they are not entirely satisfactory in all respects. For example, the vertical structure-based devices may be implemented using replacement metal gate (RMG) technology.

Advanced logic complementary metal oxide semiconductor (CMOS) scaling for fin-based devices implemented with RMG technology achieves a performance-power-area (PPA) boost over past process nodes. Unfortunately, further vertical structure-based transistor mobility in sub-seven nanometer (nm) process nodes is difficult because conventional strain boosters are reaching their limit. Therefore, a new strain booster for continued vertical structure-based transistor performance improvement is desired.

TABLE I

| | | Preferred Strain Types | |
|---|---|---|---|
| | Direction | NMOS electrons | PMOS holes |
| X | length direction (carrier S→D) | T | C |
| Y | width direction | T | T |
| Z | from body to gate | C | T |

As an example, Table I lists preferred strain types according to the X-direction, Y-direction, and Z-direction, as shown in FIG. 4. In the X-direction (e.g., a length direction from the source 302 to the drain 306) a tensile (T) strain is preferred for the N-type metal oxide semiconductor (NMOS) electrons, and a compressive (C) strain is preferred from the P-type metal oxide semiconductor (PMOS) holes. In the Y-direction (e.g., the width direction) a tensile (T) strain is preferred for both the NMOS electrons and the PMOS holes. In the Z-direction (e.g., from a body to the gate 304), a compressive (C) strain is preferred for the NMOS electrons, and a tensile (T) strain is preferred from the PMOS holes. According to aspects of the present disclosure, a vertical structure-based FET having strained source/drain regions, is described, for example, as shown in FIGS. 6A-9L.

FIGS. 6A-6E are schematic diagrams illustrating a gate all around (GAA) field effect transistor (FET) 600 having strained source and drain regions in an N-type nanosheet region, according to various aspects of the present disclosure. An XYZ axis 601 is also shown.

Figure 6A:
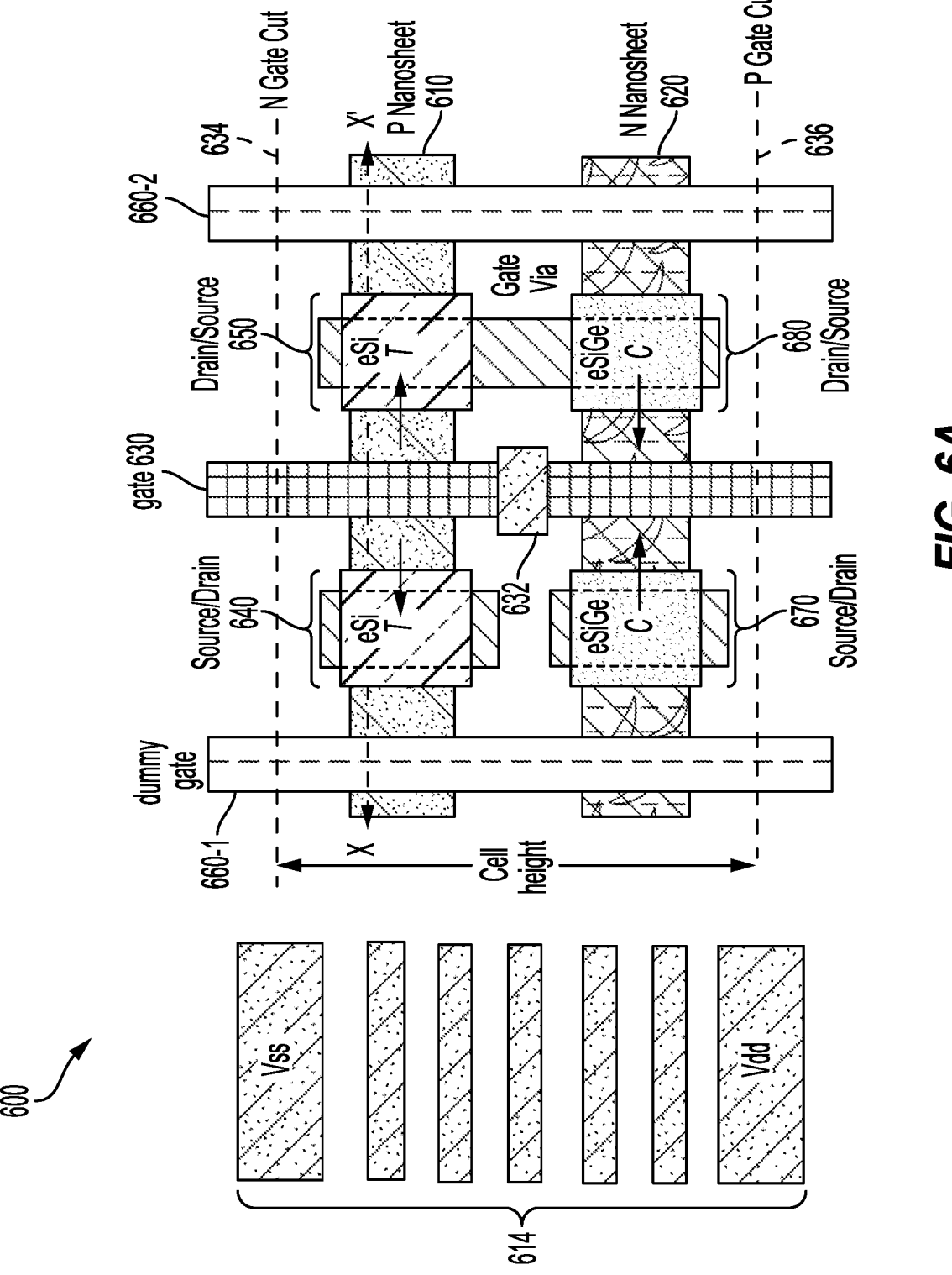
FIGS. 6A-6E are schematic diagrams illustrating a gate all around (GAA) field effect transistor (FET) having strained source and drain regions in an N-type nanosheet region, according to various aspects of the present disclosure.

FIG. 6A illustrates a layout view of the GAA FET 600 having strained source and drain regions, according to various aspects of the present disclosure. In this configuration, the GAA FET 600 includes a P-type nanosheet structure 610 (e.g., a first nanosheet structure) and a N-type nanosheet structure 620 (e.g., a second nanosheet structure). In some aspects of the present disclosure, a metal gate 630 horizontally surrounds a first channel region of the P-type nanosheet structure 610 and a second channel region of the N-type nanosheet structure 620. In this configuration, the GAA FET 600 may be referred to as a horizontal GAA FET.

In this example, the P-type nanosheet structure 610, corresponds to an N-type metal oxide semiconductor (NMOS) region, having a source/drain region 640 and a drain/source region 650. Similarly, the N-type nanosheet structure 620 corresponds to a P-type metal oxide semiconductor (PMOS) region, having a source/drain region 670 and a drain/source region 680 that are strained. For example, the source/drain region 640 may be an NMOS source region, and the drain/source region 650 may be an NMOS drain region. Alternatively, the source/drain region 640 may be a PMOS source region, and the drain/source region 650 may be PMOS drain region. In some aspects of the present disclosure, an NMOS channel of the GAA FET 600 may be composed of silicon (Si), germanium (Ge), gallium arsenide (GaAs), indium GaAs (InGaAs), gallium nitride (GaN), graphene, molybdenum disulfide ($MoS_2$), and/or phosphorus. In these aspects of the present disclosure, a PMOS channel of the GAA FET 600 may be composed of silicon (Si), germanium (Ge), silicon germanium (SiGe), indium antimonide (InSb), graphene, molybdenum disulfide ($MoS_2$), and/or phosphorus.

As further illustrated in FIG. 6A, the GAA FET 600 includes a metal gate 630 on the P-type nanosheet structure 610 and on the N-type nanosheet structure 620. In this example, the metal gate 630 includes an N-gate cut line 634 and a P-gate cut line 636. In some aspects of the present disclosure, the metal gate 630 is composed of tantalum (Ta), tantalum nitride (TaN), tantalum titanium (TaTi), titanium (Ti), titanium aluminide (TiAl), titanium aluminide carbon (TiAl:C), tungsten, nitride (W:N), platinum (Pt), and/or gold (Au). Additionally, dummy gates 660 (660-1 and 660-2) are shown.

In some aspects of the present disclosure, the source/drain region 640 and the drain/source region 650 of the P-type nanosheet structure 610 are filled with a first stressor material. Additionally, the source/drain region 670 and the drain/source region 680 of the N-type nanosheet structure 620 are filled with a second stressor material different from the first stressor material. In this example, an N-gate cut line 634 and a P-gate cut line 636 are shown. In some aspects of the present disclosure, the first stressor material and the second stressor material are selected according to the type of region (e.g., NMOS/PMOS) and the direction (e.g., X/Y/Z) using Table I.

In some aspects of the present disclosure, filling stressor materials with a tensile strain direction and/or a compressive strain direction for the source/drain regions include, but are not limited to, silicon dioxide ($SiO_2$), silicon dioxide fluorine ($SiO_2$:F), silicon dioxide nitrogen ($SiO_2$:N), silicon dioxide germanium ($SiO_2$:Ge), silicon oxynitride (SiON), silicon oxynitride fluorine (SiON:F), silicon oxynitride germanium (SiON:Ge), silicon nitride (SiN), silicon nitride germanium (SiN:Ge), hafnium oxide ($HfO_2$), hafnium zirconium oxide ($HfZrO_2$), zirconium oxide ($ZrO_2$), hafnium lanthanum oxide (HfLaO), lanthanum oxide ($LaO_2$), germanium oxide (GeOx), silicon germanium oxide (SiGeOx), embedded silicon (eSi), and embedded silicon germanium (eSiGe). Additionally, signal tracks 614 are coupled to the metal gate 630 through a gate via 632 and power rails (e.g., VDD and VSS).

Figures 6B, 6C:
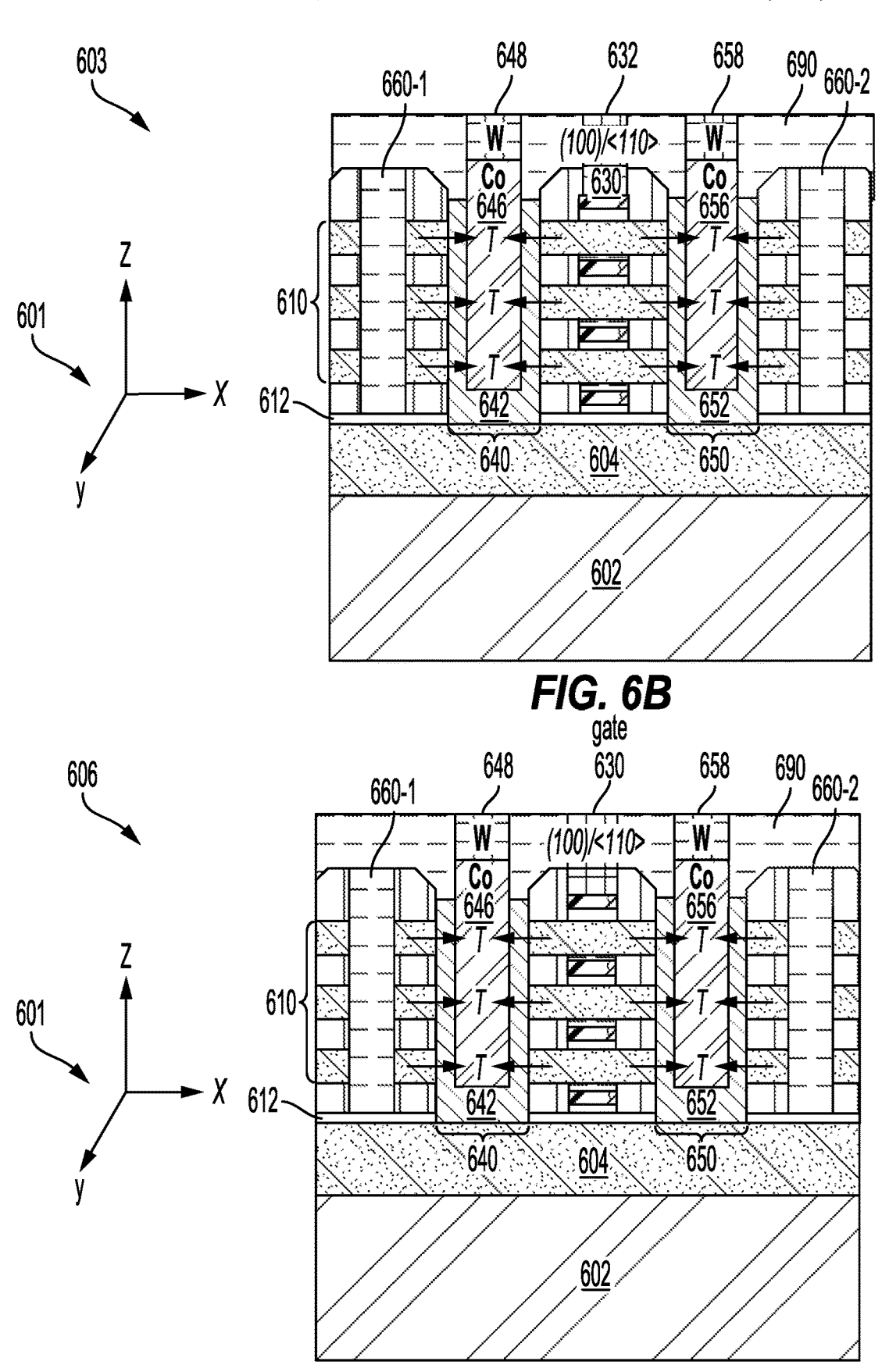

As shown in FIG. 6A, the first stressor material is shown as a tensile stressor material of embedded silicon (eSi) and the second stressor material is shown as a compressive stressor material of embedded silicon germanium (eSiGe). FIGS. 6B and 6C show cross-sectional views along cutline XX' along the P-type nanosheet structure 610. In some aspects of the present disclosure, FIGS. 6B and 6C illustrate two variations for forming of the source/drain region 640 and the drain/source region 650 of the GAA FET 600 of FIG. 6A, having a transport orientation of (100)/<110> (side wall).

FIG. 6B illustrates a cross-sectional view 603 of the GAA FET 600, in which the source/drain region 640 includes a stressor material spacer 642 (e.g., a first stressor material spacer) on a base and surrounding sidewalls of a contact trench of the source/drain region 640. Similarly, the drain/source region 650 includes a stressor material spacer 652 (e.g., a second stressor material spacer) on a base and surrounding sidewalls of a contact trench of the drain/source region 650. Additionally, a source/drain contact 648 is coupled to the stressor material spacer 642 on the surrounding sidewalls and the base of the contact trench of the source/drain region 640 through a metal to diffusion (MD) contact 646 (e.g., an inner contact plug). A drain/source contact 658 is coupled to the stressor material spacer 652 on the surrounding sidewalls and the base of the contact trench of the drain/source region 650 through an MD contact 656 (e.g., an inner contact plug). In this aspect of the present disclosure, the stressor material spacer 642 and the stressor material spacer 652 are epitaxially grown on a semiconductor base layer 604 on a substrate 602, including a dielectric isolation layer 612.

FIG. 6C illustrates a cross-sectional view 606 of the GAA FET 600, in which the source/drain region 640 includes the stressor material spacer 642 on the base and surrounding sidewalls of the contact trench of the source/drain region 640. Additionally, the source/drain contact 648 is coupled to the stressor material spacer 642 through the MD contact 646. Similarly, the drain/source region 650 includes the stressor material spacer 652 on a base and surrounding sidewalls of the contact trench of the drain/source region 650. Additionally, the drain/source contact 658 is coupled to the stressor material spacer 652 through the MD contact 656. In this aspect of the present disclosure, the stressor material spacer 642 and the stressor material spacer 652 are epitaxially grown on the dielectric isolation layer 612 on the semiconductor base layer 604 on the substrate 602. As shown in FIGS. 6B and 6C, the source/drain contact 648 (e.g., tungsten (W)) and the MD contact 646 (e.g., cobalt (Co) or molybdenum (Mo)) are composed of varied materials. Similarly, the drain/source contact 658 and the MD contact 656 are composed of varied materials.

Figure 6D:
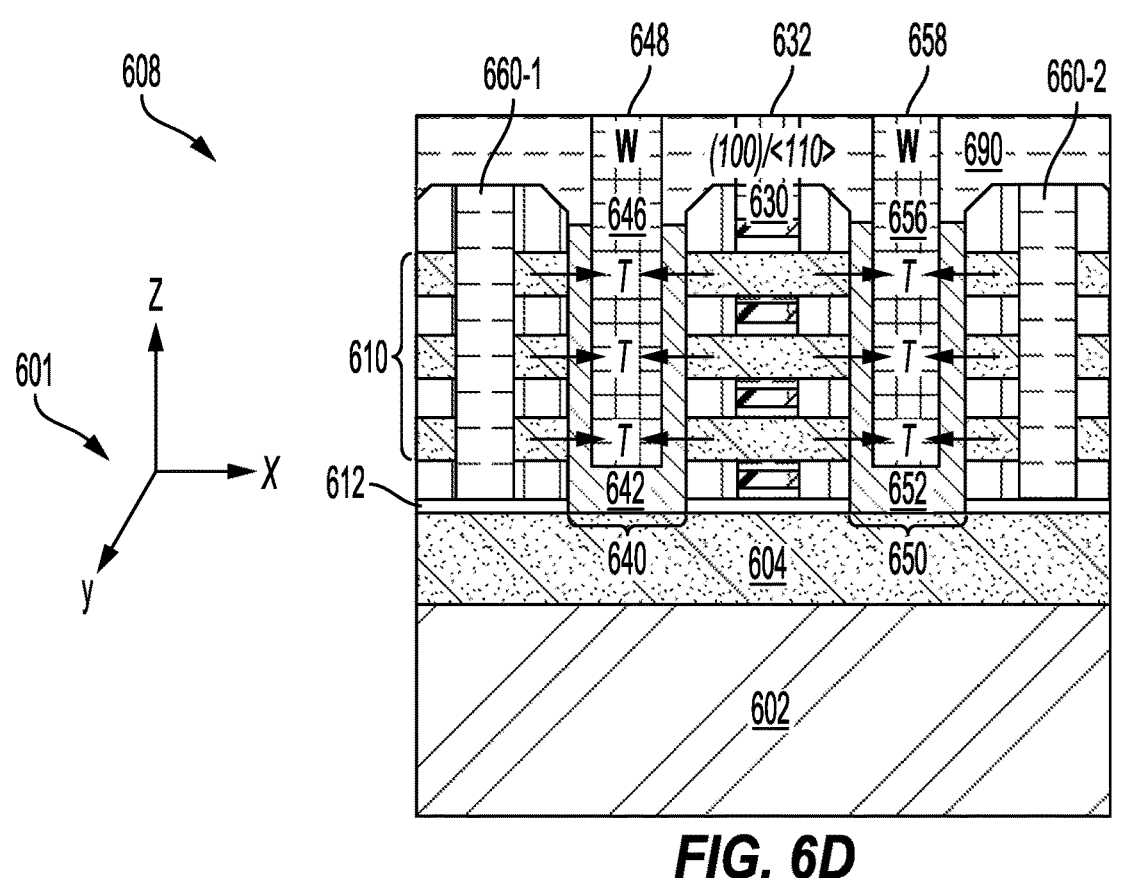
Figure 6E:
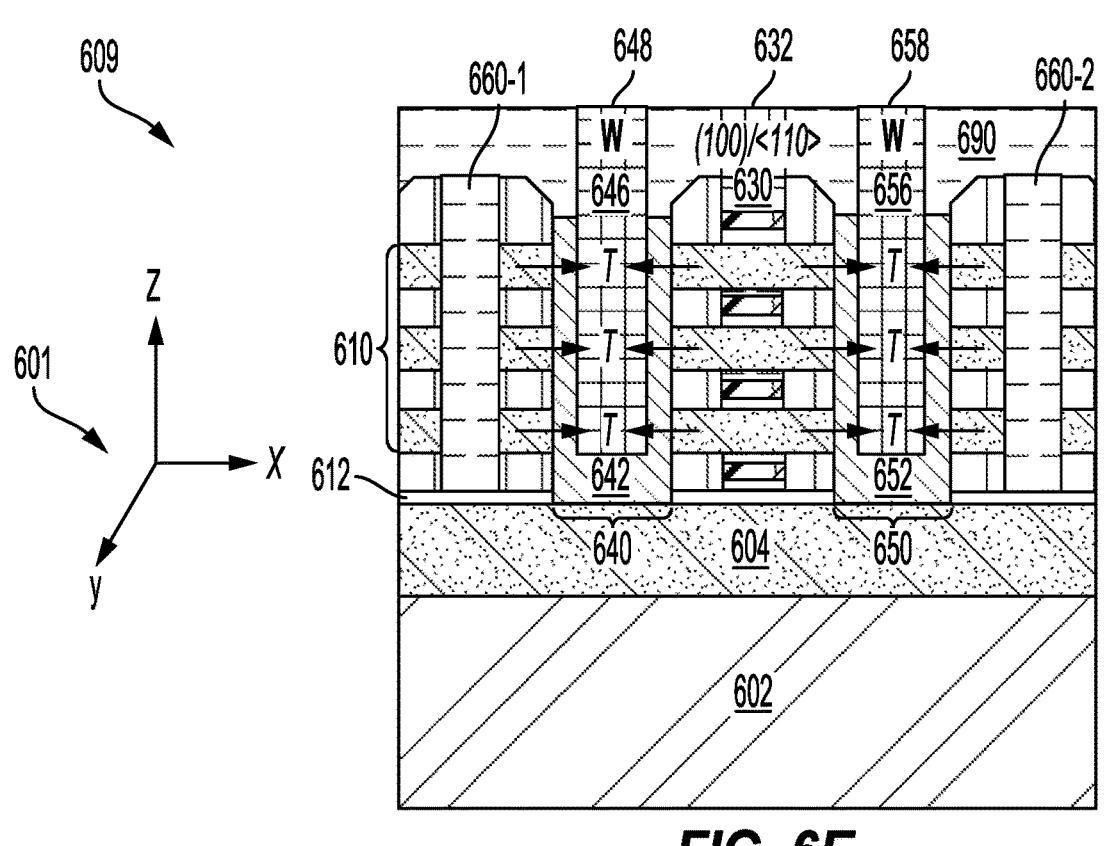

FIGS. 6D and 6E show cross-sectional views along cutline XX' illustrating two further variations for forming of the source/drain region 640 and the drain/source region 650 of the GAA FET 600 of FIG. 6A. FIG. 6D illustrates a cross-sectional view 608 of the GAA FET 600, in which the source/drain region 640 includes the stressor material spacer 642 on the base and surrounding sidewalls of a contact trench of the source/drain region 640. Additionally, the source/drain contact 648 is coupled to the stressor material spacer 642 through the MD contact 646. Similarly, the drain/source region 650 includes the stressor material spacer 652 on the base and surrounding sidewalls of the contact trench of the drain/source region 650. Additionally, the drain/source contact 658 is coupled to the stressor material spacer 652 through the MD contact 656. In this aspect of the present disclosure, the stressor material spacer 642 and the stressor material spacer 652 are epitaxially grown on the semiconductor base layer 604 on the substrate 602, including the dielectric isolation layer 612.

FIG. 6E illustrates a cross-sectional view 609 of the GAA FET 600, in which the source/drain region 640 includes the stressor material spacer 642 on the base and surrounding sidewalls of the contact trench of the source/drain region 640. Additionally, the source/drain contact 648 is coupled to the stressor material spacer 642 through the MD contact 646. Similarly, the drain/source region 650 includes the stressor material spacer 652 on a base and surrounding sidewalls of the contact trench of the drain/source region 650. Additionally, the drain/source contact 658 is coupled to the stressor material spacer 652 through the MD contact 656. In this aspect of the present disclosure, the stressor material spacer 642 and the stressor material spacer 652 are epitaxially grown on the dielectric isolation layer 612 of the semiconductor base layer 604 on the substrate 602. As shown in FIGS. 6D and 6E, the source/drain contact 648 and the MD contact 646 are composed of the same material (e.g., tungsten (W)). Similarly, the drain/source contact 658 and the MD contact 656 are composed of the same material (e.g., tungsten (W)).

FIGS. 7A-7E are schematic diagrams illustrating a gate all around (GAA) field effect transistor (FET) 600 having strained source and drain regions in a P-type nanosheet region, according to various aspects of the present disclosure. An XYZ axis 701 is also shown.

Figure 7A:
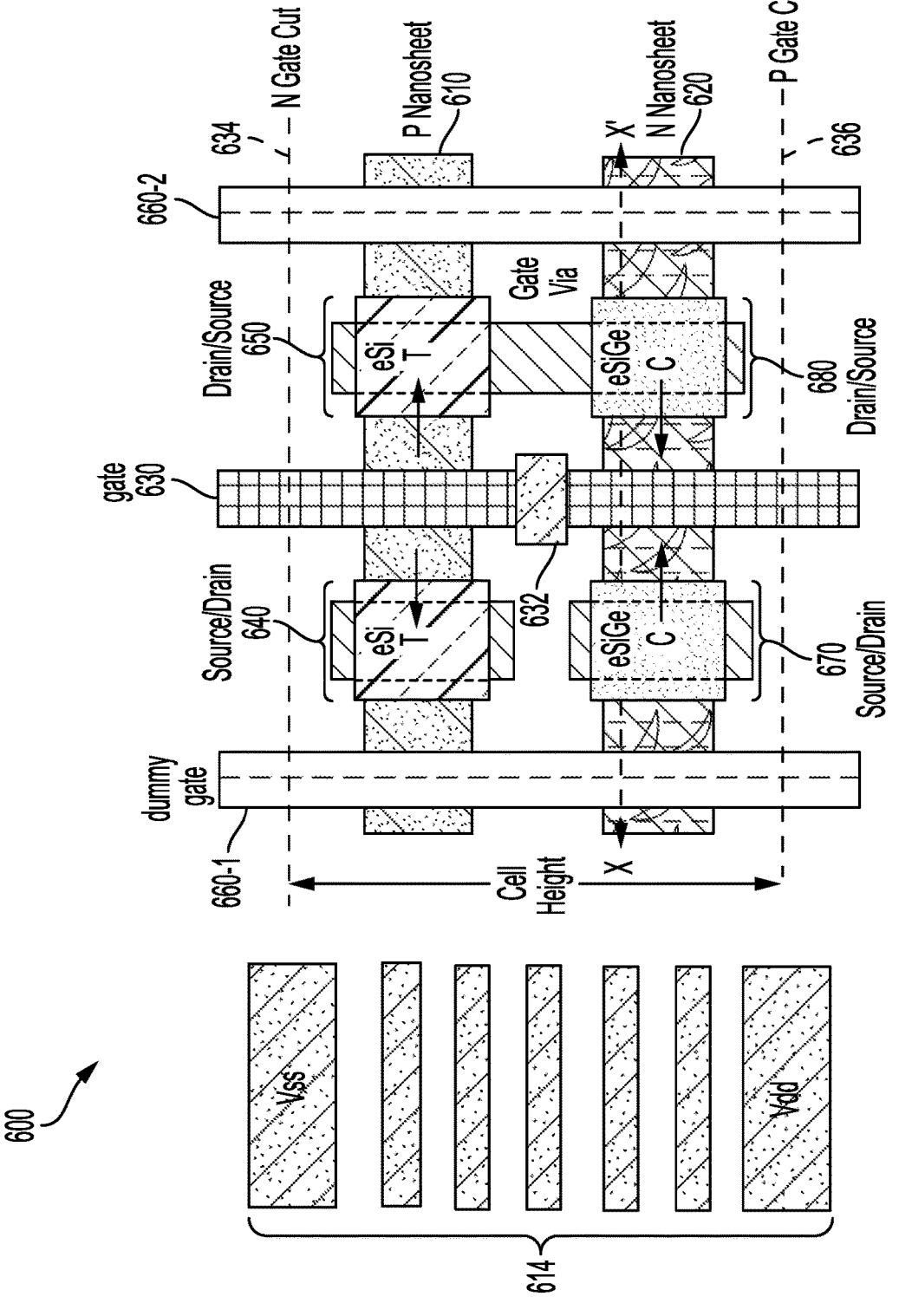
FIGS. 7A-7E are schematic diagrams illustrating a gate all around (GAA) field effect transistor (FET) having strained source and drain regions in a P-type nanosheet region, according to various aspects of the present disclosure.
Figures 7B, 7C:
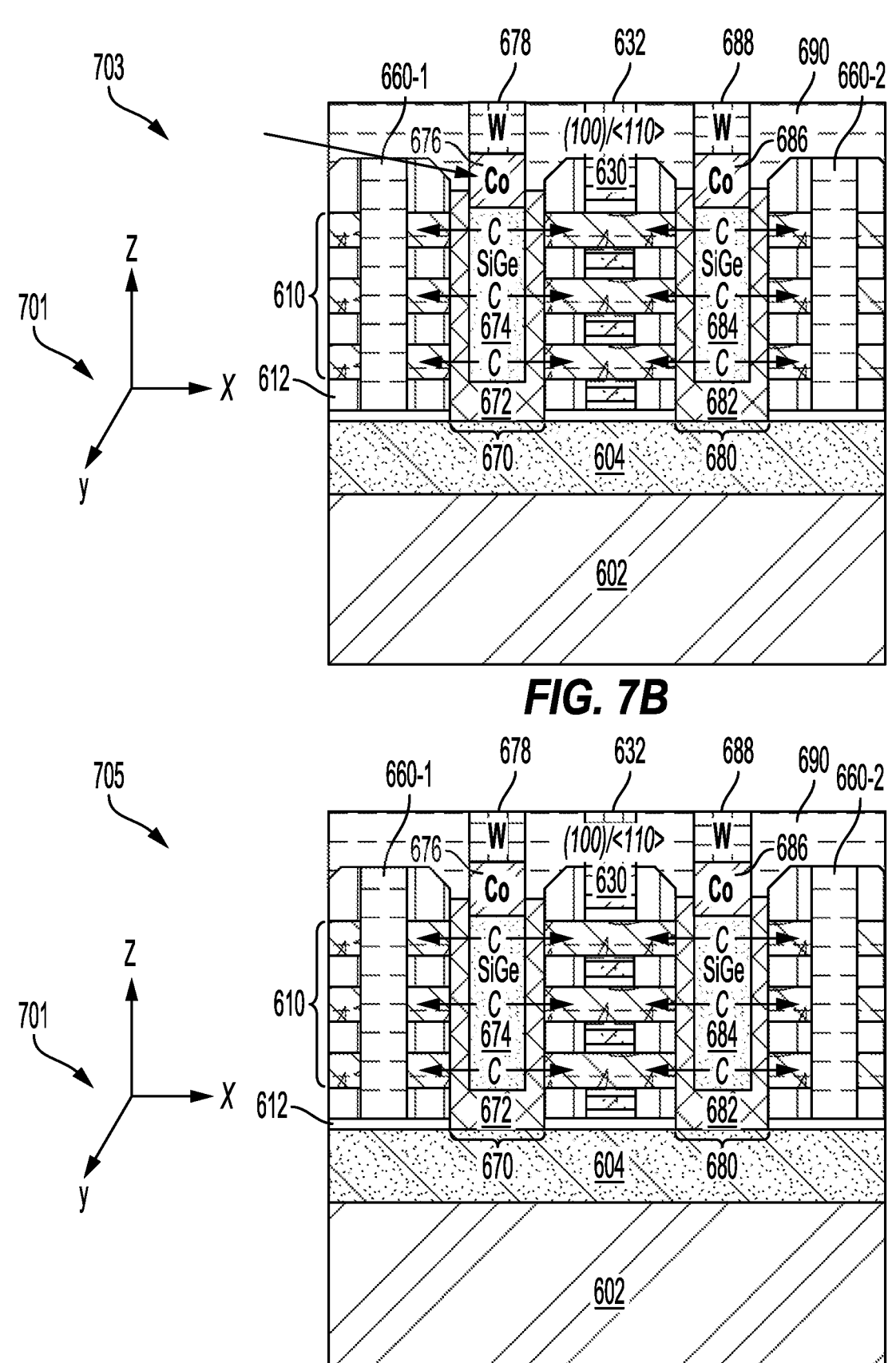

FIG. 7A further illustrates the GAA FET 600 of FIG. 6A, showing a cutline XX' along the N-type nanosheet structure 620, according to aspects of the present disclosure. FIGS. 7B and 7C also show cross-sectional views along cutline XX' of the N-type nanosheet structure 620. In some aspects of the present disclosure, FIGS. 7B and 7C illustrate two variations for forming of the source/drain region 670 and the drain/source region 680 of the GAA FET 600 shown in FIG. 7A, having a transport orientation of (100)/<110> (side wall).

FIG. 7B illustrates a cross-sectional view 703 of the GAA FET 600 of FIG. 7A, in which the source/drain region 670 includes a stressor material spacer 672 on a base and surrounding sidewalls of a contact trench of the source/drain region 670. Similarly, the drain/source region 680 includes a stressor material spacer 682 on a base and surrounding sidewalls of a contact trench of the drain/source region 680. Additionally, a stressor material plug 674 is coupled to the stressor material spacer 672 on the surrounding sidewalls and the base of the contact trench of the source/drain region 670. A source/drain contact 678 is coupled to the stressor material plug 674 through an MD contact 676. Similarly, a drain/source contact 688 is coupled to the stressor material plug 684 through an MD contact 686. In this aspect of the present disclosure, the stressor material spacer 672 and the stressor material spacer 682 are epitaxially grown on the semiconductor base layer 604 on the substrate 602.

FIG. 7C illustrates a cross-sectional view 705 of the GAA FET 600 of FIG. 7A, in which the source/drain region 670 includes the stressor material spacer 672 on the base and surrounding sidewalls of the contact trench of the source/drain region 670. Additionally, the stressor material plug 674 is coupled to the stressor material spacer 672 in the source/drain region 670. Similarly, the drain/source region 680 includes the stressor material spacer 682 on a base and surrounding sidewalls of the contact trench of the drain/source region 680. Additionally, the stressor material plug 684 is coupled to the stressor material spacer 682 in the drain/source region 680. The source/drain contact 678 is coupled to the stressor material plug 674 through the MD contact 676. Similarly, the drain/source contact 688 is coupled to the stressor material plug 684 through the MD contact 686. In this aspect of the present disclosure, the stressor material spacer 672 and the stressor material spacer 682 are epitaxially grown on the dielectric isolation layer 612 of the semiconductor base layer 604 on the substrate 602. As shown in FIGS. 7B and 7C, the source/drain contact 678 (e.g., tungsten (W)) and the MD contact 676 (e.g., cobalt (Co) or molybdenum (Mo)) are composed of varied materials. Similarly, the drain/source contact 688 and the MD contact 686 are composed of varied materials.

Figures 7D, 7E:
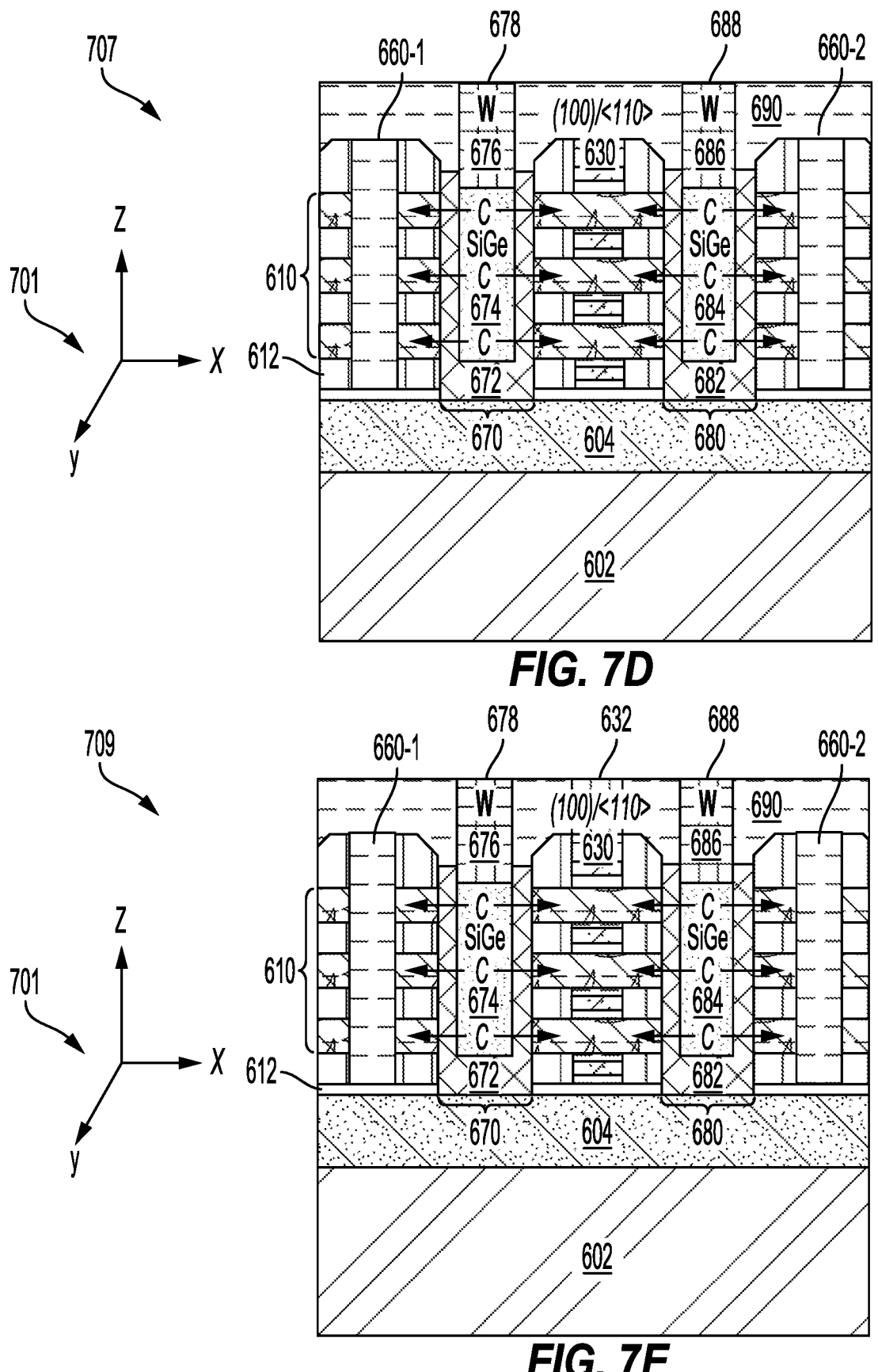

FIGS. 7D and 7E show cross-sectional views along cutline XX' illustrating two further variations for forming of the source/drain region 670 and the drain/source region 680 of the GAA FET 600 of FIG. 7A. FIG. 7D illustrates a cross-sectional view 707 of the GAA FET 600, in which the source/drain region 670 includes the stressor material spacer 672 on the base and surrounding sidewalls of the contact trench of the source/drain region 670. Similarly, the drain/source region 680 includes the stressor material spacer 682 on the base and surrounding sidewalls of the contact trench of the drain/source region 680. Additionally, the stressor material plug 674 is coupled to the stressor material spacer 672 in the source/drain region 670. The stressor material plug 684 is coupled to the stressor material spacer 682 in the drain/source region 680. The MD contact 676 is coupled to the stressor material plug 674, and the MD contact 686 is coupled to the stressor material plug 684. In this aspect of the present disclosure, the stressor material spacer 672 and the stressor material spacer 682 are epitaxially grown on the semiconductor base layer 604 on the substrate 602.

FIG. 7E illustrates a cross-sectional view 709 of the GAA FET 600 of FIG. 7A, in which the source/drain region 670 includes the stressor material spacer 672 on the base and surrounding sidewalls of the contact trench of the source/drain region 670. Additionally, the stressor material plug 674 is coupled to the stressor material spacer 672 on the surrounding sidewalls and the base of the contact trench of the source/drain region 670. Similarly, the drain/source region 680 includes the stressor material spacer 682 on a base and surrounding sidewalls of the contact trench of the drain/source region 680. Additionally, the stressor material plug 684 is coupled to the stressor material spacer 682 in the drain/source region 680. The source/drain contact 678 is coupled to the stressor material plug 674, and the drain/source contact 688 is coupled to the stressor material plug 684. In this aspect of the present disclosure, the stressor material spacer 672 and the stressor material spacer 682 are epitaxially grown on a dielectric isolation layer 612 of the semiconductor base layer 604 on the substrate 602. As shown in FIGS. 7D and 7E, the source/drain contact 678 and the MD contact 676 are composed of the same material (e.g., tungsten (W)). Similarly, the drain/source contact 688 and the MD contact 686 are composed of the same material (e.g., tungsten (W)).

FIGS. 8A-8M are schematic diagrams illustrating a process for forming the GAA FET 600 of FIG. 6A, according to the strained source and drain region configuration shown in FIG. 6B, according to various aspects of the present disclosure.

Figures 8A, 8B:
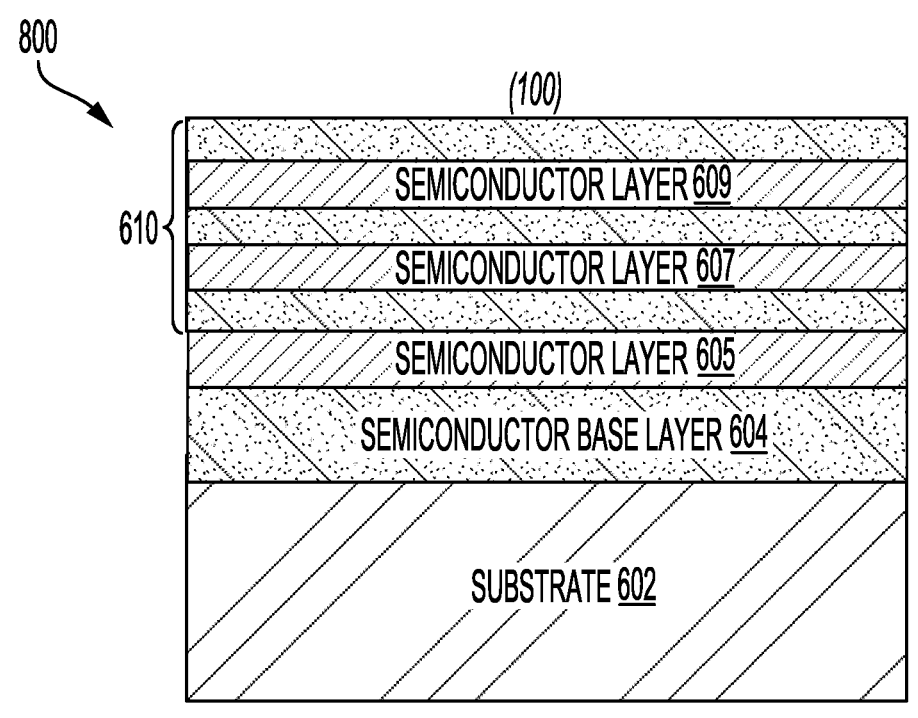
FIGS. 8A-8M are schematic diagrams illustrating a process for forming the GAA FET of FIG. 6A, according to the strained source and drain region configuration shown in FIG. 6B, according to various aspects of the present disclosure.

FIG. 8A illustrates a first step 800 in the process of forming the GAA FET 600 having strained source and drain regions, according to some aspects of the present disclosure. At the first step 800, the P-type nanosheet structure 610 is formed on the semiconductor base layer 604 on the substrate 602. The first step 800 may include P-type well (Pwell) photo opening and implanting into the substrate 602 to form the Pwell for the NMOS region of the P-type nanosheet structure 610 according to a (100) surface orientation. Next, multiple semiconductor layers (e.g., 604, 605, 607, and 609)

are epitaxially grown (e.g., silicon (Si) germanium (SiGe)/Si layers) on the substrate 602. Once the semiconductor layers (e.g., 604, 605, 607, and 609) are formed, an oxide diffusion (OD) area of the NMOS region is patterned. Once the OD area of the NMOS region is patterned, an NMOS channel opening is implanted for the NMOS channel.

FIG. 8B illustrates a next step 810 in the process of forming the GAA FET 600 having strained source and drain regions, according to various aspects of the present disclosure. At step 810, a dummy polysilicon layer is deposited and patterned to form dummy gates 812 (812-1, 812-2, 812-3) on a surface of the P-type nanosheet structure 610.

Figure 8C:
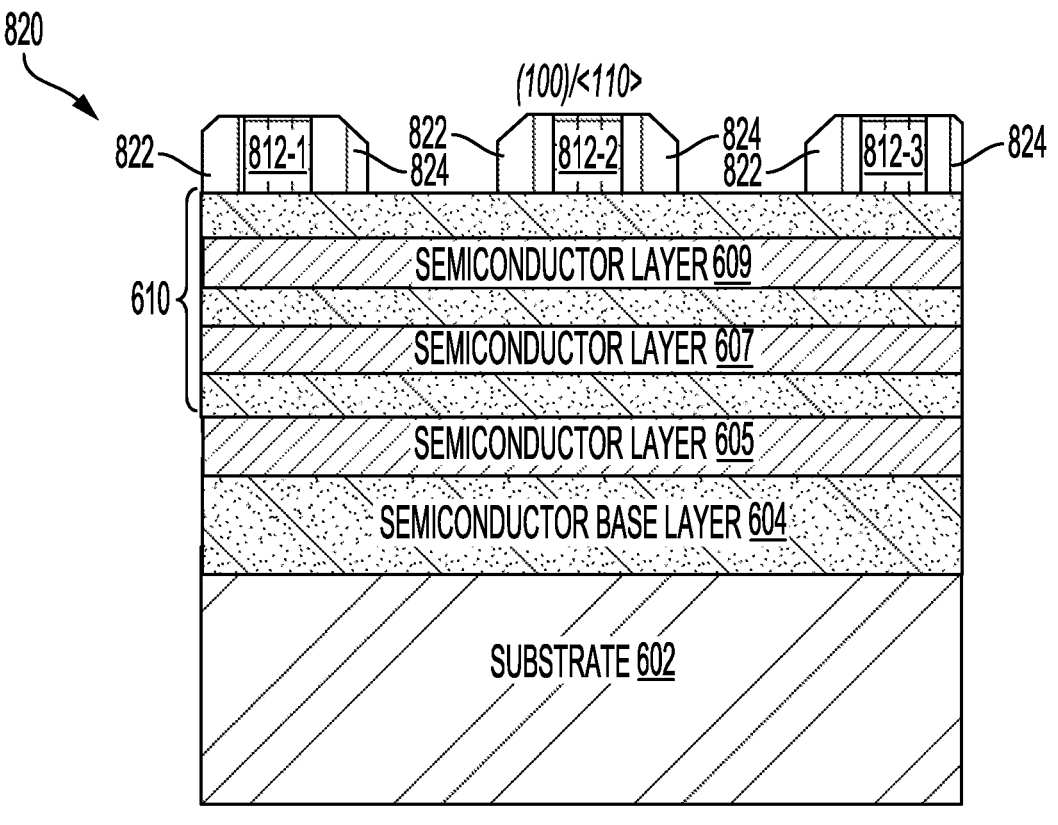

FIG. 8C illustrates a next step 820 in the process of forming the GAA FET 600 having strained source and drain regions, according to various aspects of the present disclosure. At step 820, once the dummy gates 812 (812-1, 812-2, 812-3) are formed, a silicon nitride (SiN) film is deposited and etched back to form spacers 822, 824 on the sidewalls of the dummy gates 812 (812-1, 812-2, 812-3).

Figure 8D:
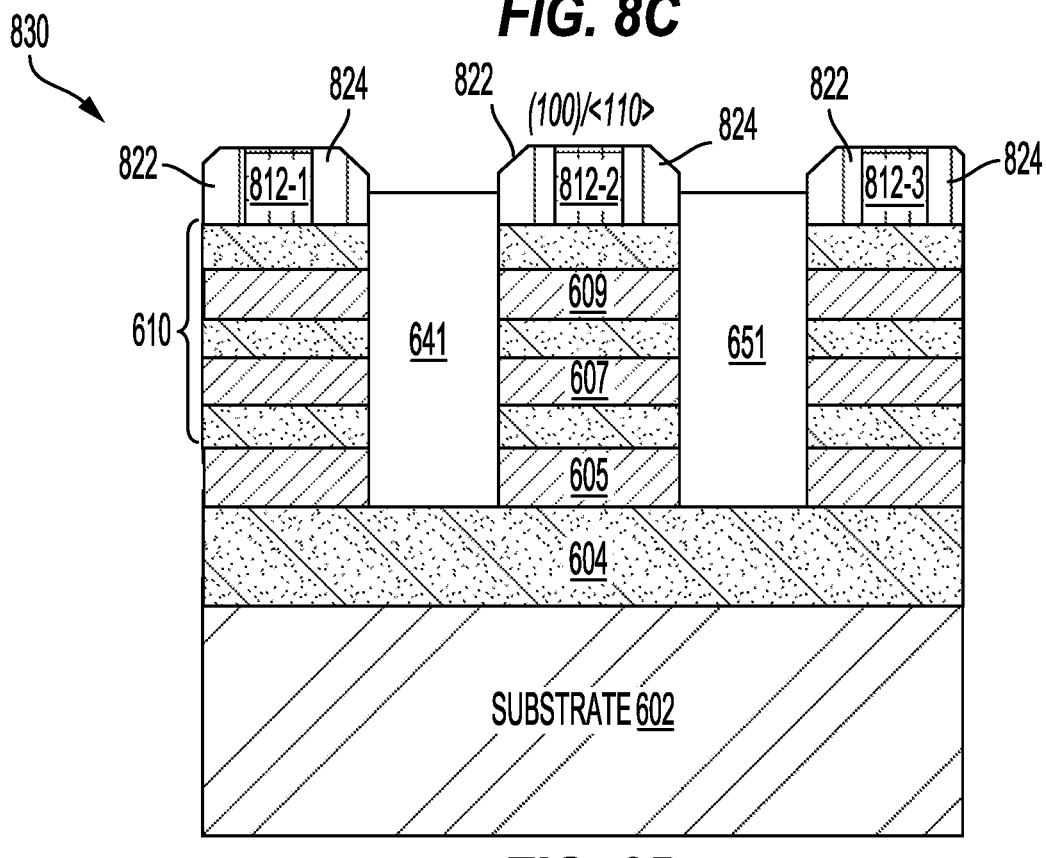

FIG. 8D illustrates a next step 830 in the process of forming the GAA FET 600 having strained source and drain regions, according to various aspects of the present disclosure. At step 830, a nanosheet source/drain region cut is performed. In this example, the nanosheet source/drain region cut forms a source/drain trench 641 (e.g., a first trench) and a drain/source trench 651 (e.g., a second trench). For example, the step 830 includes patterning the dummy gates 812 (812-1, 812-2, 812-3) and the spacers 822, 824 to enable the nanosheet cut and recess of the semiconductor layers 605, 607, and 609 to form an inner spacer, as shown in FIG. 8E.

Figures 8E, 8F:
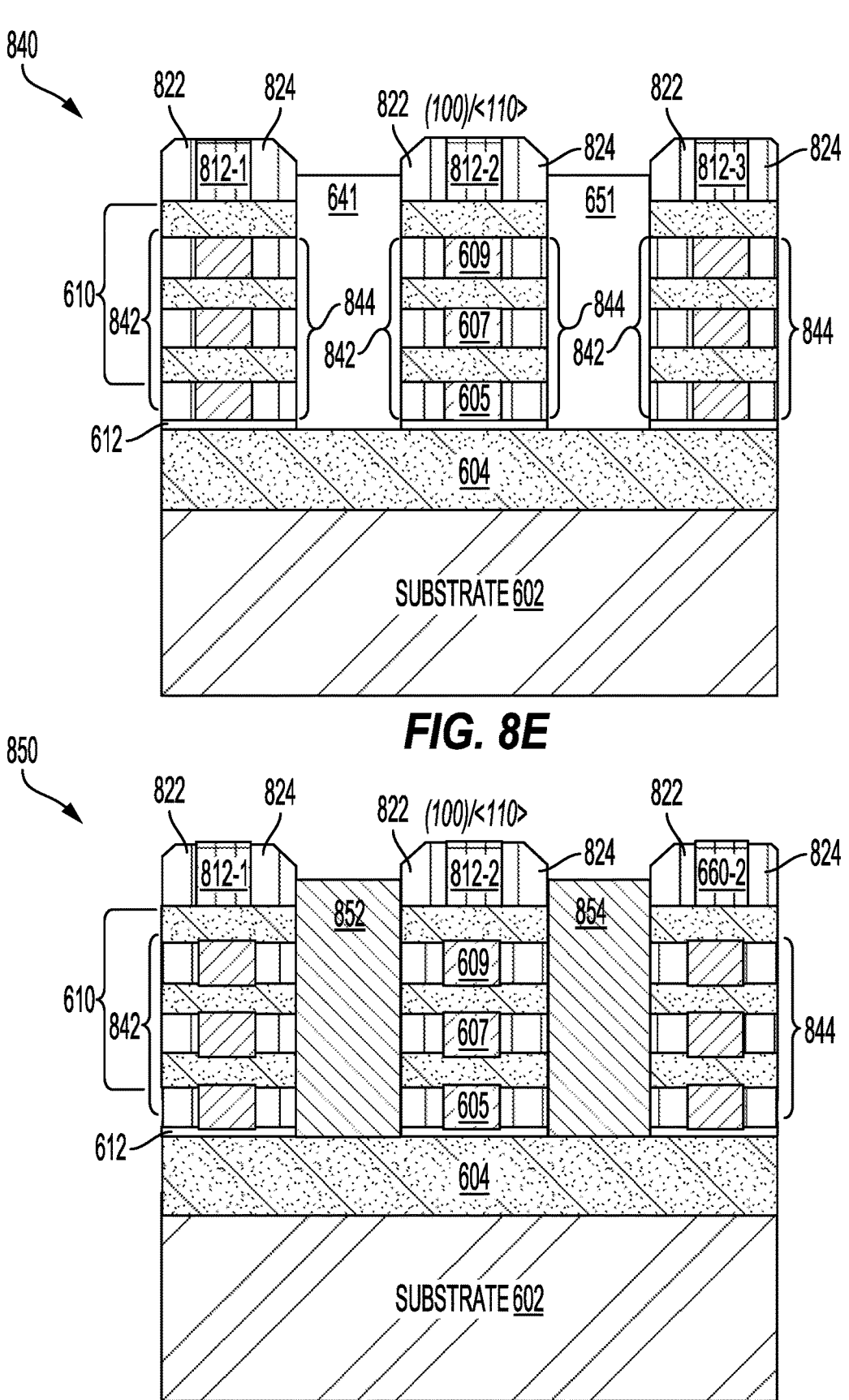

FIG. 8E illustrates a next step 840 in the process of forming the GAA FET 600 having strained source and drain regions, according to various aspects of the present disclosure. At step 840, the semiconductor layers 605, 607, and 609 (e.g., SiGe layers) are recessed. Once recessed, a silicon nitride (SiN) film is deposited and etched back to form inner spacers 842, 844 of the dummy gates 812 (812-1, 812-2, 812-3).

FIG. 8F illustrates a next step 850 in the process of forming the GAA FET having strained source and drain regions, according to various aspects of the present disclosure. At step 850, an N+ tensile stressor material (e.g., embedded silicon (eSi)) is epitaxially grown on the semiconductor base layer 604 to fill the source/drain trench 641 with a tensile stressor material 852 and the drain/source trench 651 with a tensile stressor material 854.

Figures 8G, 8H:
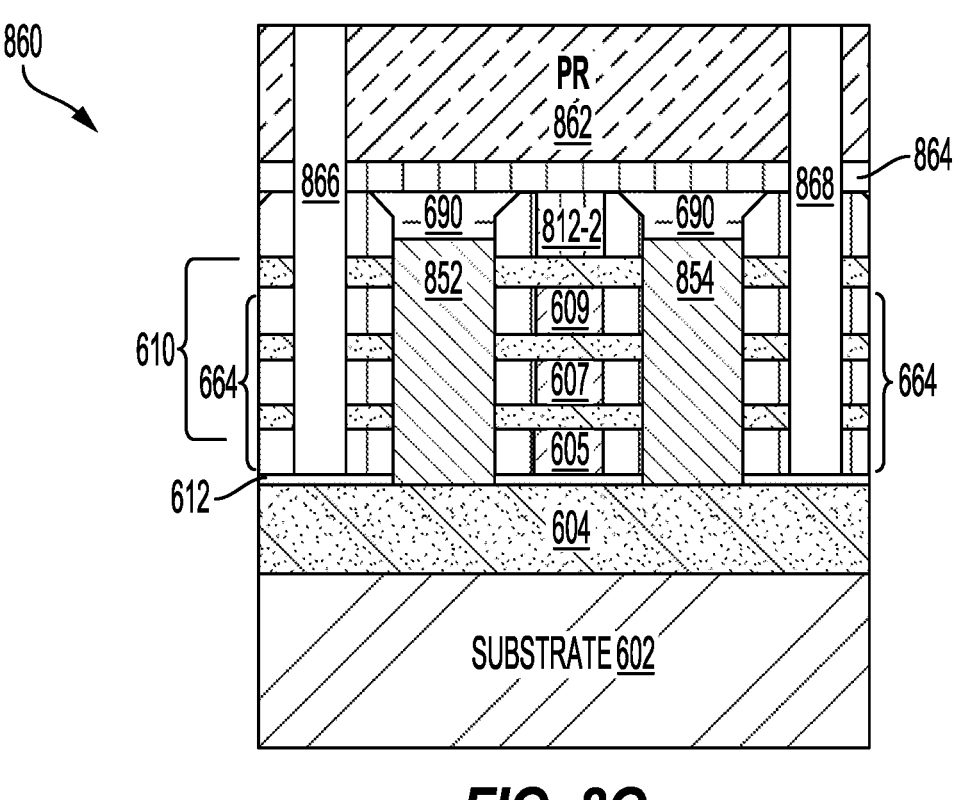

FIG. 8G illustrates a next step 860 in the process of forming the GAA FET 600 having strained source and drain regions, according to various aspects of the present disclosure. At step 860, an interlayer dielectric (ILD) oxide is deposited, and a chemical mechanical polish (CMP) is performed to form the ILD oxide layer 690. Next, a hardmask layer 864 is deposited. Subsequently, a photoresist (PR) layer 862 is deposited and used to open dummy gate areas, corresponding to the dummy gates 660-1 and 660-2. Next, an etch process removes the dummy gates 812-1, 812-3 to form dummy gate trenches 866 and 868. Once formed, the PR layer 862 is stripped and an oxide is deposited in the dummy gate trenches 866 and 868, and a CMP process is performed to complete formation of the dummy gates 660-1 and 660-2, as shown in FIG. 8H.

FIG. 8H illustrates a next step 865 in the process of forming the GAA FET 600 having strained source and drain regions, according to various aspects of the present disclosure. At step 865, the PR layer 862 on the hardmask layer 864 is used to form an opening in the hardmask layer 864.

Next, the deep trench contact opening 867 and the deep trench contact opening 869 are formed in the tensile stressor material 852 in the source/drain region 640 and the tensile stressor material 854 in the drain/source region 650 to a depth below the P-type nanosheet structure 610. Etching into the tensile stressor material 852 enables initial formation of the stressor material spacer 642. Additionally, etching in the tensile stressor material 854 in the drain/source region 650 enables initial formation of the stressor material spacer 652. Step 865 is completed by removal of the PR layer 862.

Figures 8I, 8J:
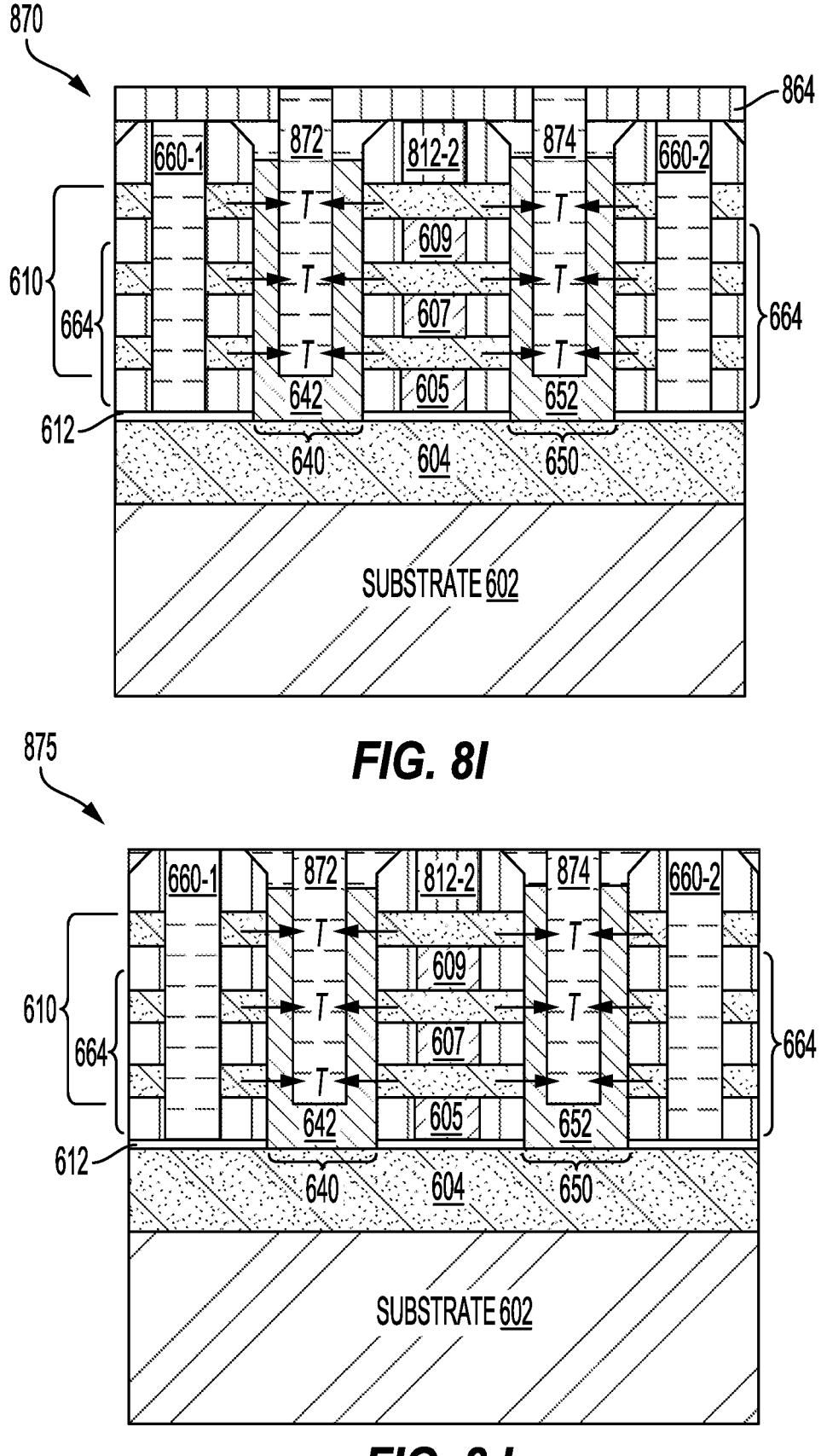

FIG. 8I illustrates a next step 870 in the process of forming the GAA FET 600 having strained source and drain regions, according to various aspects of the present disclosure. At step 870, a photoresist is used to fill the deep trench contact opening 867 and the deep trench contact opening 869. Next, the photoresist in the deep trench contact opening 867 and the deep trench contact opening 869 (see FIG. 8H) is opened using a photo exposure process to remove the photoresist from the deep trench contact opening 867 and the deep trench contact opening 869. Once the photoresist is removed from the deep trench contact opening 867 and the deep trench contact opening 869, a tensile oxide 872 is deposited in the deep trench contact opening 867, and a tensile oxide 874 is deposited in the deep trench contact opening 869. Once deposited, the tensile oxides 872 and 874 are subjected to a CMP process.

FIG. 8J illustrates a next step 875 in the process of forming the GAA FET 600 having strained source and drain regions, according to various aspects of the present disclosure. At step 875, the hardmask layer 864 is removed and an exposed surface is subjected to a CMP process.

Figure 8K:
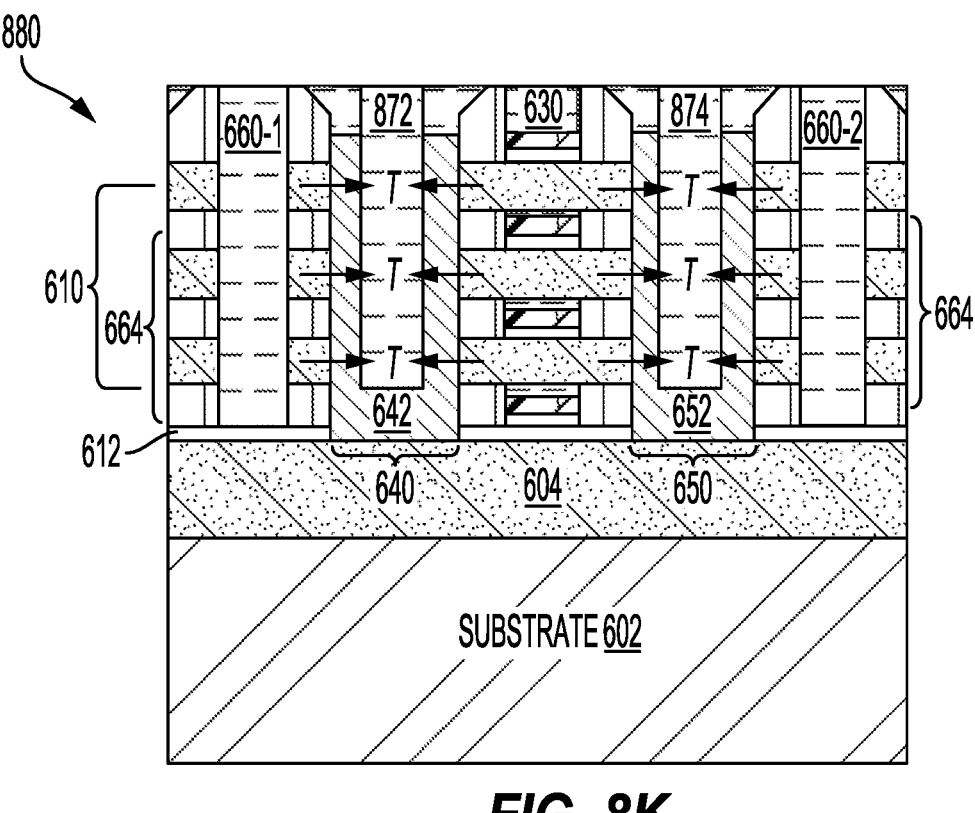

FIG. 8K illustrates a step 880 in the process of forming the GAA FET 600 having strained source and drain regions, according to various aspects of the present disclosure. At step 880, the dummy gate 812-2 is removed, as well as the dummy semiconductor layers (605, 607, and 609) shown in FIG. 8J. Once removed, a replacement metal gate (RMG) process is performed to form the metal gate 630. Step 880 is completed by performing a CMP process on the metal gate 630.

Figure 8L:
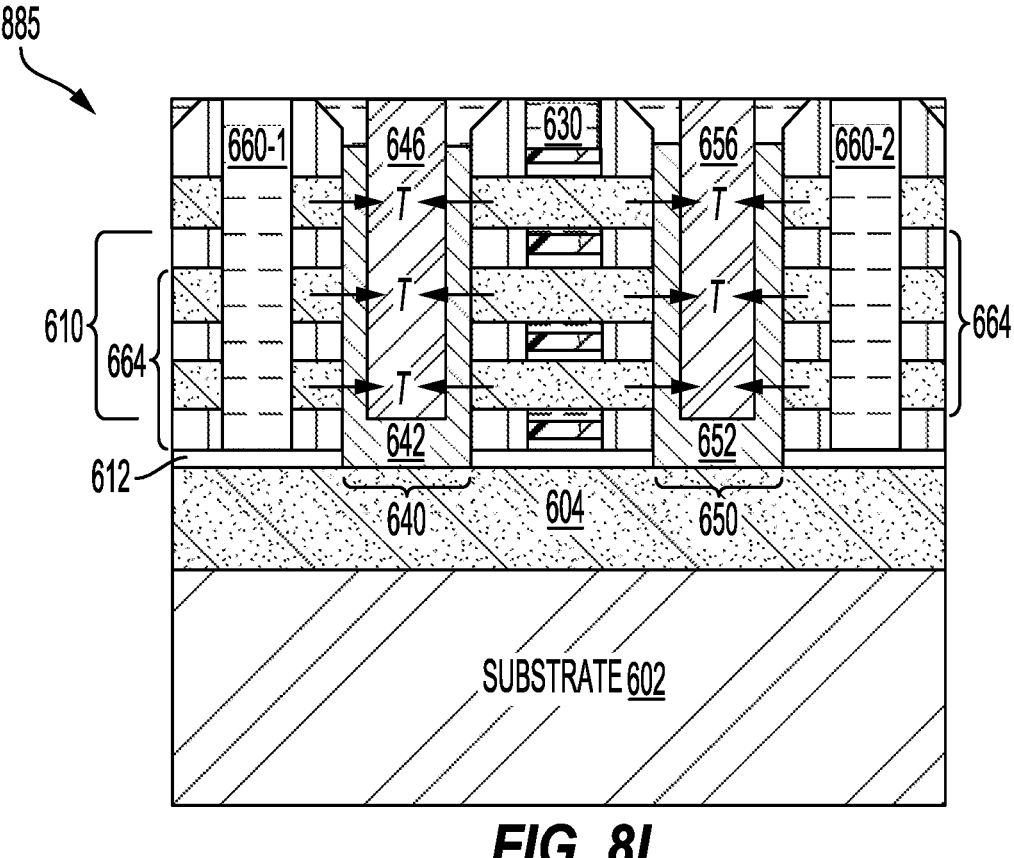

FIG. 8L illustrates a next step 885 in the process of forming the GAA FET 600 having strained source and drain regions, according to various aspects of the present disclosure. At step 885, metal to diffusion (MD) contact openings are formed by removing the tensile oxide 872 from the deep trench contact opening 867, and the tensile oxide 874 from the deep trench contact opening 869 (see FIGS. 8H-8K). Next, an N+ implant is performed in the stressor material spacer 642 and the stressor material spacer 652. Following the N+ implant, a titanium (Ti), cobalt (Co), or nickel (Ni) film is deposited and annealed to form an Ni silicide (NiSi), Ti silicide (TiSi), or cobalt silicide (CoSi) film on exposed surfaces of the stressor material spacer 642 and the stressor material spacer 652. Once formed, an MD film metal (e.g., tungsten (W), cobalt (Co), molybdenum (Mo) or like film metal) is deposited to form the MD contact 646 to the source/drain region 640 and the MD contact 656 to the drain/source region 650. This process is completed by performing a CMP process on the MD contact 646 and the MD contact 656 in the drain/source region 650.

Figure 8M:
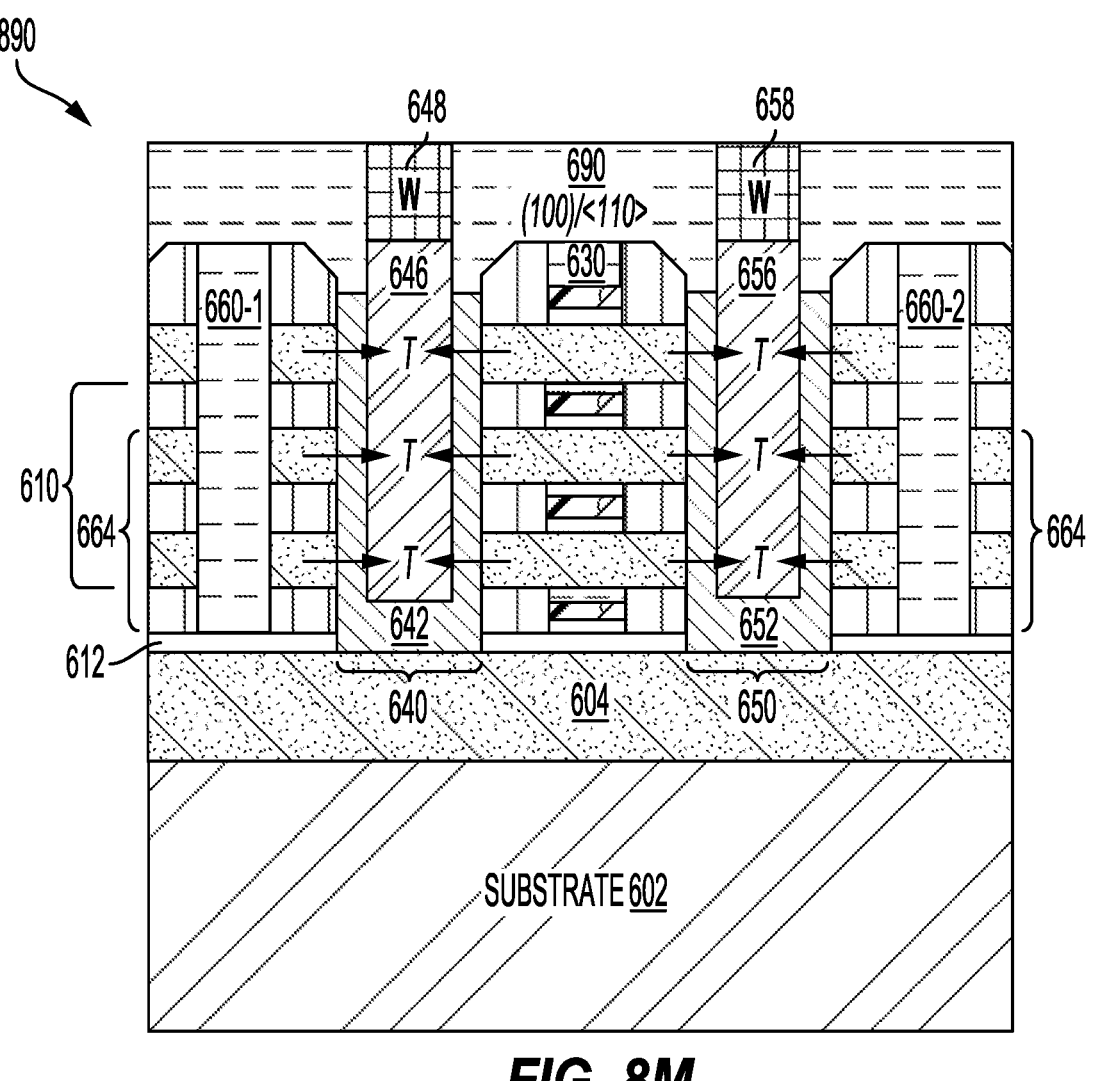

FIG. 8M illustrates a last step 890 in the process of forming the GAA FET 600 having strained source and drain regions, according to various aspects of the present disclosure. At step 890, a conductive material is deposited in the V0 opening to form a V0 contact (e.g., the source/drain contact 648) to the MD contact 646 in the source/drain region 640, and a V0 contact (e.g., the drain/source contact

658) to the MD contact 656 in the drain/source region 650. This process is completed by performing a CMP process on the source/drain contact 648 and the drain/source contact 658.

FIGS. 9A-9M are schematic diagrams illustrating a process for forming the GAA FET 600 of FIG. 7A, according to the strained source and drain region configuration shown in FIG. 7B, according to various aspects of the present disclosure.

Figures 9A, 9B:
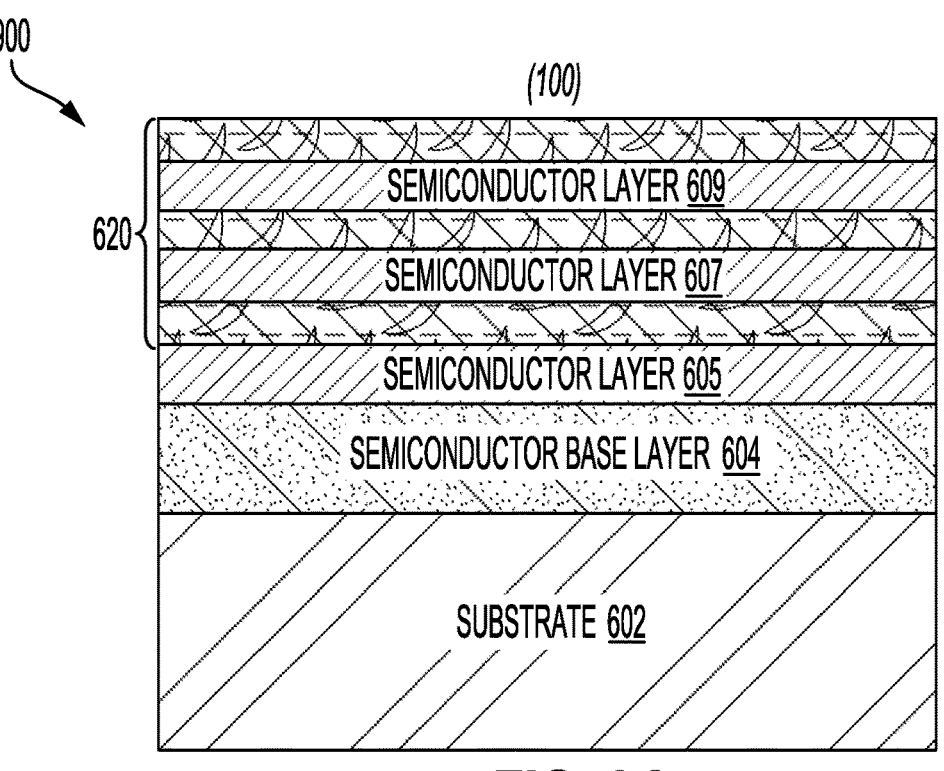
FIGS. 9A-9M are schematic diagrams illustrating a process for the GAA FET of FIG. 7A, according to the strained source and drain region configuration shown in FIG. 7B, according to various aspects of the present disclosure.

FIG. 9A illustrates a first step 900 in the process of forming the GAA FET 600 having strained source and drain regions, according to various aspects of the present disclosure. At the first step 900, the N-type nanosheet structure 620 is formed on the semiconductor base layer 604 on the substrate 602. The first step 900 may include N-type well (Nwell) photo opening and implanting into the substrate 602 to form the Nwell for the PMOS region of the N-type nanosheet structure 620 according to a (100) surface orientation. Next, multiple semiconductor layers (e.g., 604, 605, 607, and 609) are epitaxially grown (e.g., silicon (Si) germanium (SiGe)/Si layers) on the substrate 602. Once the semiconductor layers (e.g., 604, 605, 607, and 609) are formed, an oxide diffusion (OD) area of the PMOS region is patterned. Once the OD area of the PMOS region is patterned, a PMOS channel opening is implanted for the PMOS channel.

FIG. 9B illustrates a next step 910 in the process of forming the GAA FET 600 having strained source and drain regions, according to various aspects of the present disclosure. At step 910, a dummy polysilicon layer is deposited and patterned to form dummy gates 912 (912-1, 912-2, 912-3) on a surface of the N-type nanosheet structure 620.

Figures 9C, 9D:
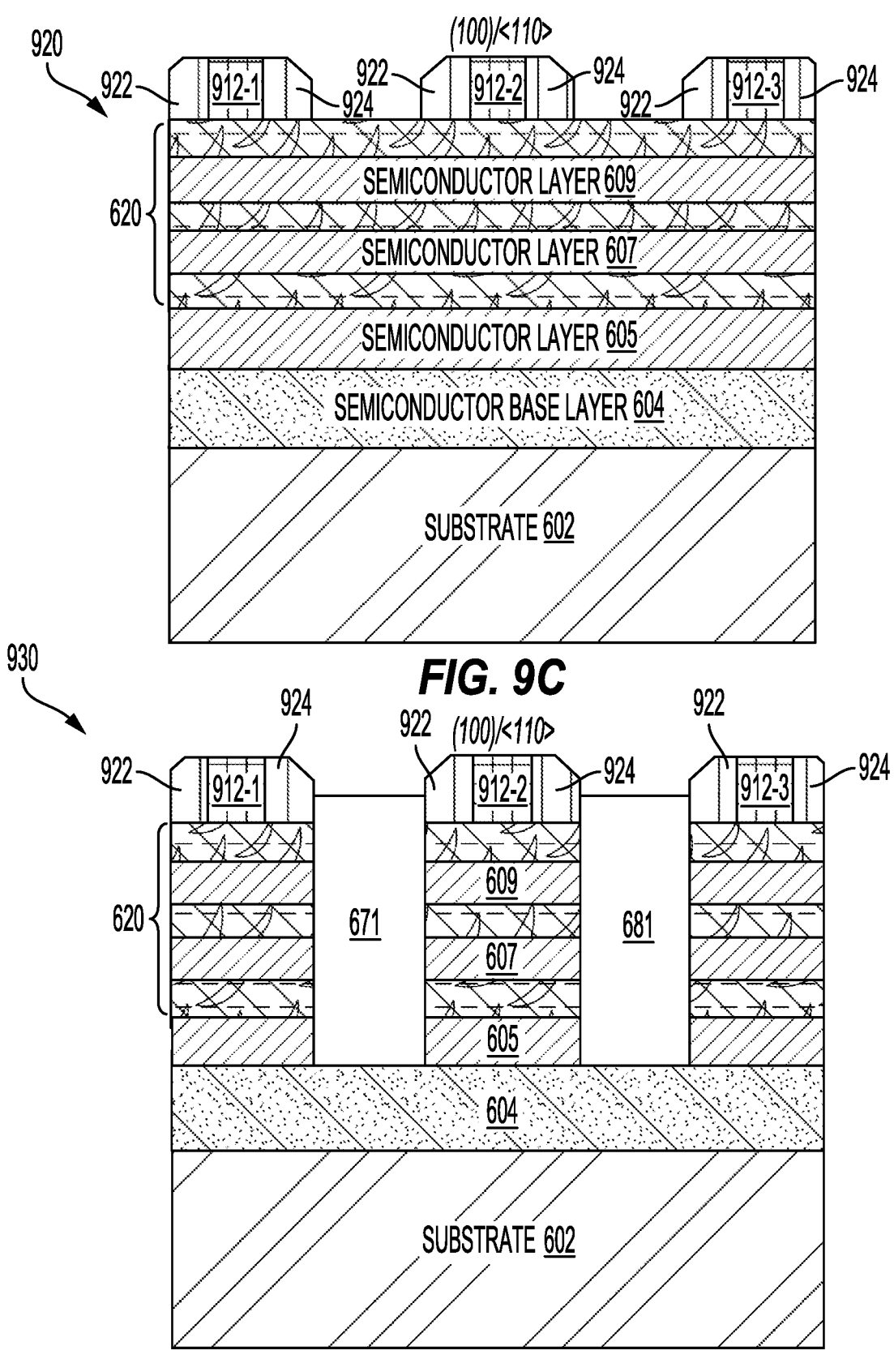

FIG. 9C illustrates a next step 920 in the process of forming the GAA FET 600 having strained source and drain regions, according to various aspects of the present disclosure. At step 920, once the dummy gates 912 (912-1, 912-2, 912-3) are formed, a silicon nitride (SiN) film is deposited and etched back to form spacers 922, 924 on the sidewalls of the dummy gates 912 (912-1, 912-2, 912-3).

FIG. 9D illustrates a next step 930 in the process of forming the GAA FET 600 having strained source and drain regions, according to various aspects of the present disclosure. At step 930, a nanosheet source/drain region cut is performed. In this example, the nanosheet source/drain region cut forms a source/drain trench 671 and a drain/source trench 681. For example, the step 930 includes patterning the dummy gates 912 (912-1, 912-2, 912-3) and the spacers 922, 924 to enable the nanosheet cut and recess of the semiconductor layers 605, 607, and 609 to form an inner spacer, as shown in FIG. 9E.

Figures 9E, 9F:
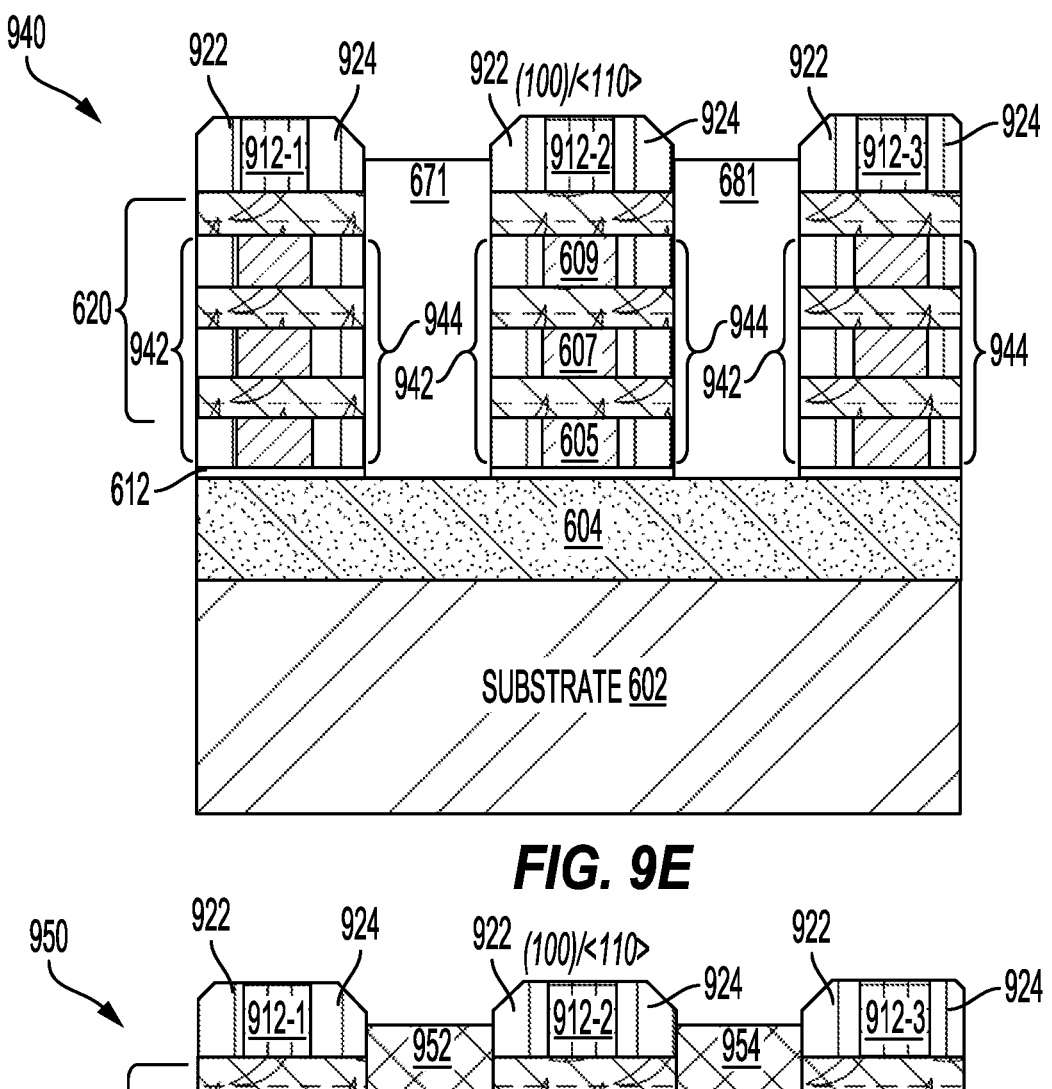

FIG. 9E illustrates a next step 940 in the process of forming the GAA FET 600 having strained source and drain regions, according to various aspects of the present disclosure. At step 940, the semiconductor layers 605, 607, and 609 (e.g., SiGe layers) are recessed. Once recessed, a silicon nitride (SiN) film is deposited and etched back to form inner spacers 942, 944 of the dummy gates 912 (912-1, 912-2, 912-3).

FIG. 9F illustrates a next step 950 in the process of forming the GAA FET 600 having strained source and drain regions, according to various aspects of the present disclosure. At step 950, a P+ compress stressor material (e.g., embedded silicon germanium (eSiGe)) is epitaxially grown on the semiconductor base layer 604 to fill the source/drain trench 671 with a compress stressor material 952 and the drain/source trench 681 with a compress stressor material 954.

Figures 9G, 9H:
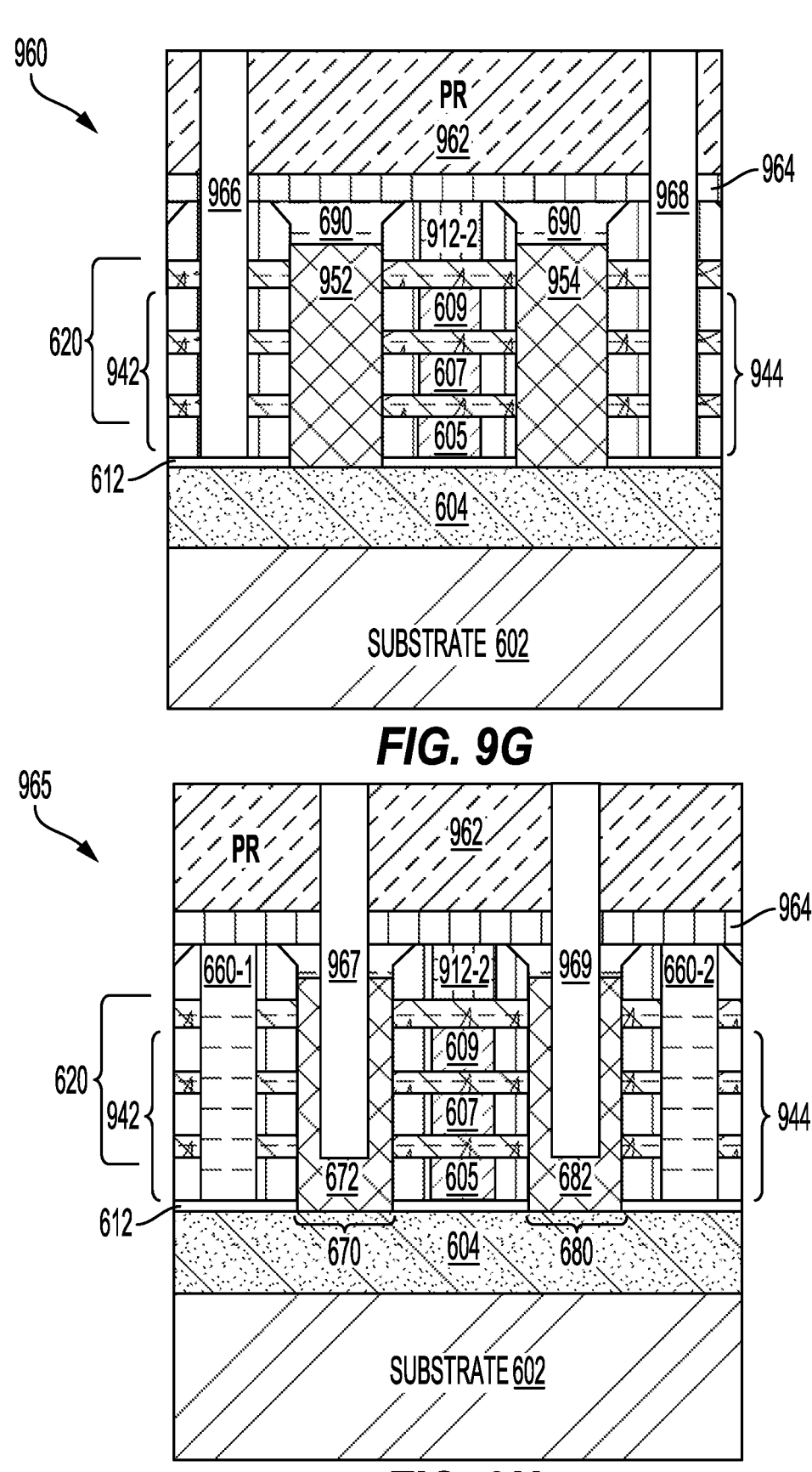

FIG. 9G illustrates a next step 960 in the process of forming the GAA FET 600 having strained source and drain regions, according to various aspects of the present disclosure. At step 960, an interlayer dielectric (ILD) oxide is deposited, and a chemical mechanical polish (CMP) is performed to form an ILD oxide layer 690. Next, a hardmask (HM) layer 964 is deposited. Subsequently a photoresist (PR) layer 962 is deposited and used to open dummy gate areas, corresponding to the dummy gates 660-1 and 660-2. Next, an etch process is performed to remove the dummy gates 912-1, 912-3 to form dummy gate trenches 966 and 968. Once formed, the PR layer 962 is stripped and an oxide is deposited in dummy gate trenches 966 and 968, and a CMP process is performed to complete formation of the dummy gates 660-1 and 660-2, as shown in FIG. 9H.

FIG. 9H illustrates a next step 965 in the process of forming the GAA FET 600 having strained source and drain regions, according to various aspects of the present disclosure. At step 965, the PR layer 962 on the HM layer 964 is used to form an opening in the HM layer 964. Next, deep trench contact openings 967, 969 are formed in the compress stressor material 952 in the source/drain region 670 and the compress stressor material 954 in the drain/source region 680, respectively, to a depth below the N-type nanosheet structure 620. Etching into the compress stressor material 952 enables initial formation of the stressor material spacer 672. Additionally, etching in the compress stressor material 954 in the drain/source region 680 enables initial formation of the stressor material spacer 682. Step 965 is completed by removal of the PR layer 962.

Figures 9I, 9J:
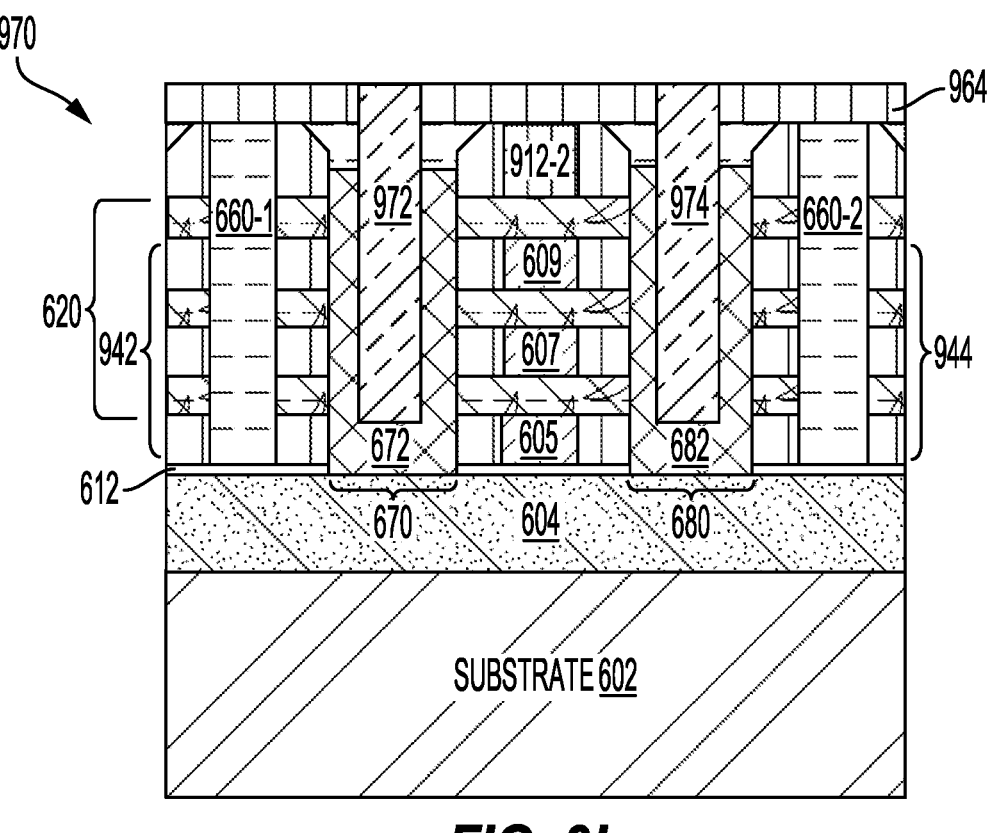

FIG. 9I illustrates a next step 970 in the process of forming the GAA FET 600 having strained source and drain regions, according to various aspects of the present disclosure. At step 970, a photoresist is used to fill the deep trench contact openings 967, 969 to form PR deep trench contacts 972, 974 (see FIG. 9H). Once deposited, the deep trench contacts 972, 974 may be subjected to a CMP process.

FIG. 9J illustrates a next step 975 in the process of forming the GAA FET 600 having strained source and drain regions, according to various aspects of the present disclosure. At step 975, a P+ compressive material (e.g., SiGe with higher Ge concentration to provide more compressive stress) is epitaxially grown in the stressor material spacer 672 in the source/drain region 670. Additionally, a P+ compressive material (e.g., SiGe with higher Ge concentration to provide more compressive stress) is epitaxially grown in the stressor material spacer 682 in the drain/source region 680. For example, epitaxial growth of a P+ compressive SiGe material with higher Ge concentration to provide more compressive stress may be performed without concern for SiGe dislocation defects because the P+ compressive SiGe material is surrounded by lower dose SiGe source/drain layers. Step 975 is completed by subjecting the ILD oxide layer 690 to a CMP process.

Figure 9K:
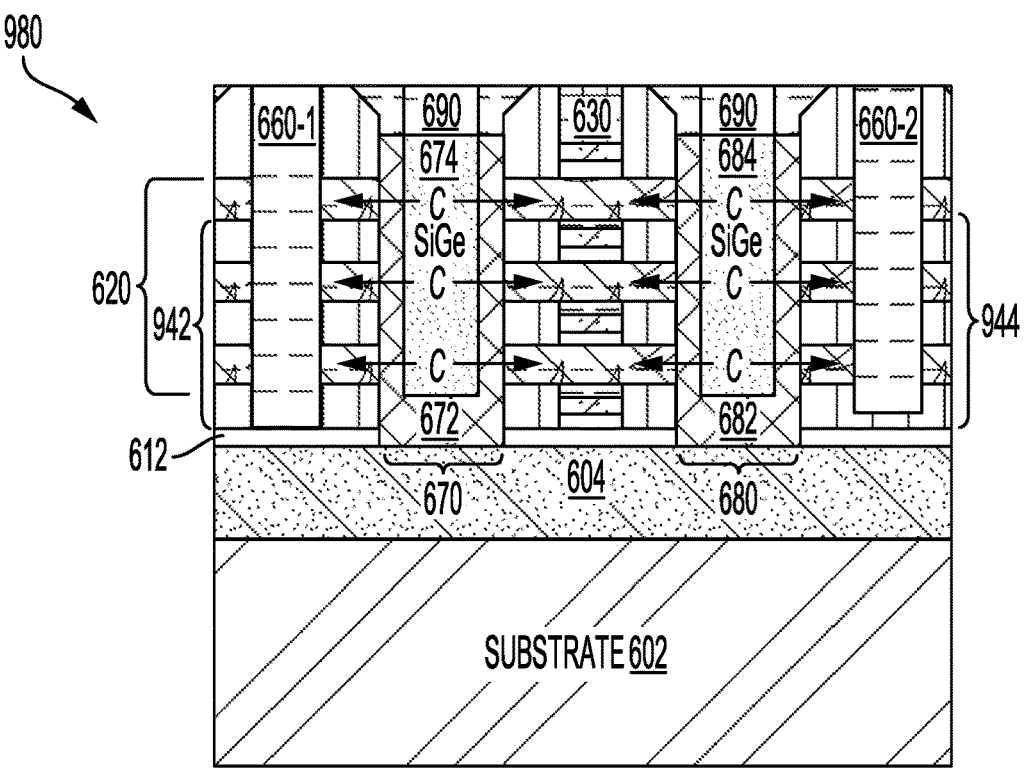

FIG. 9K illustrates a next step 980 in the process of forming the GAA FET 600 having strained source and drain regions, according to various aspects of the present disclosure. At step 980, the dummy gate 912-2 is removed, as well as dummy semiconductor layers (605, 607, and 609) shown in FIG. 9J. Once removed, a replacement metal gate (RMG) process forms the metal gate 630. Step 980 is completed by performing a CMP process on the metal gate 630.

Figure 9L:
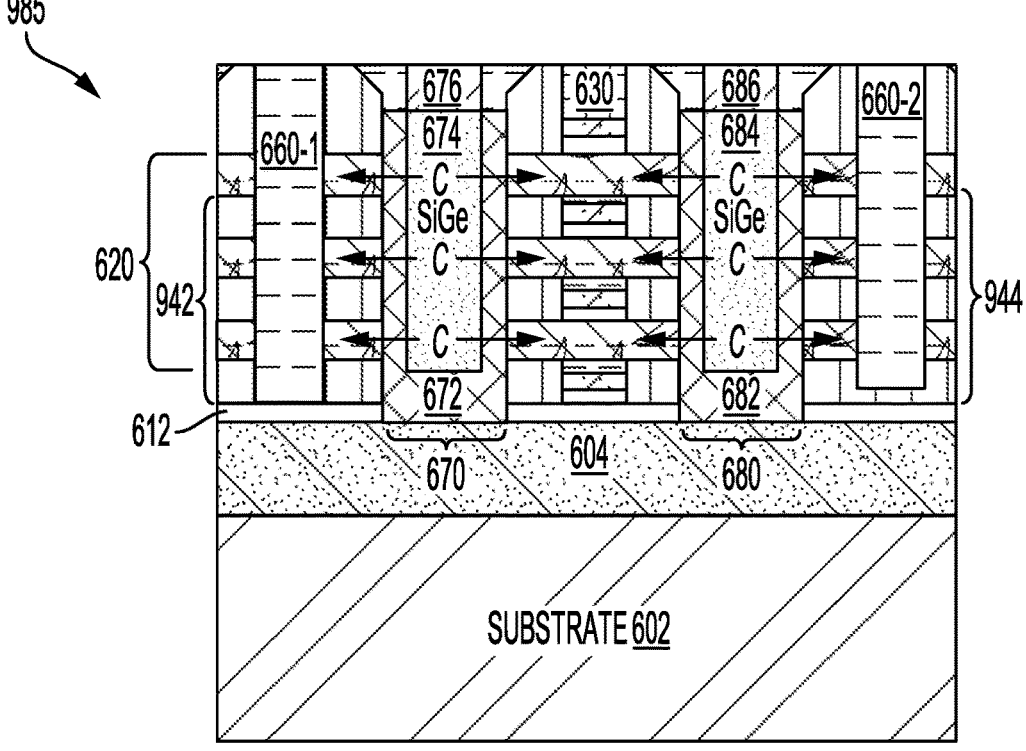

FIG. 9L illustrates a next step 985 in the process of forming the GAA FET 600 having strained source and drain regions, according to various aspects of the present disclosure. At step 985, metal to diffusion (MD) contact openings are formed within the ILD oxide layer 690 to expose the stressor material plug 674 in the source/drain region 670 and the stressor material plug 684 in the drain/source region 680. Next a P+ implant is performed in the stressor material spacer 672 and the stressor material spacer 682. Following the P+ implant, a titanium (Ti), nickel (Ni), or cobalt (Co) film is deposited and annealed to form an Ni silicide (NiSi), a Ti silicide (TiSi), or a cobalt (Co) silicide (CoSi) film on exposed surfaces of the stressor material spacer 672 and the stressor material spacer 682. Once formed, an MD film metal (e.g., tungsten (W), cobalt (Co), molybdenum (Mo), or like film metal) is deposited to form the MD contact 676 to the source/drain region 670 and the MD contact 686 to the drain/source region 680. This process is completed by performing a CMP process on the MD contact 676 and the MD contact 686.

Figure 9M:
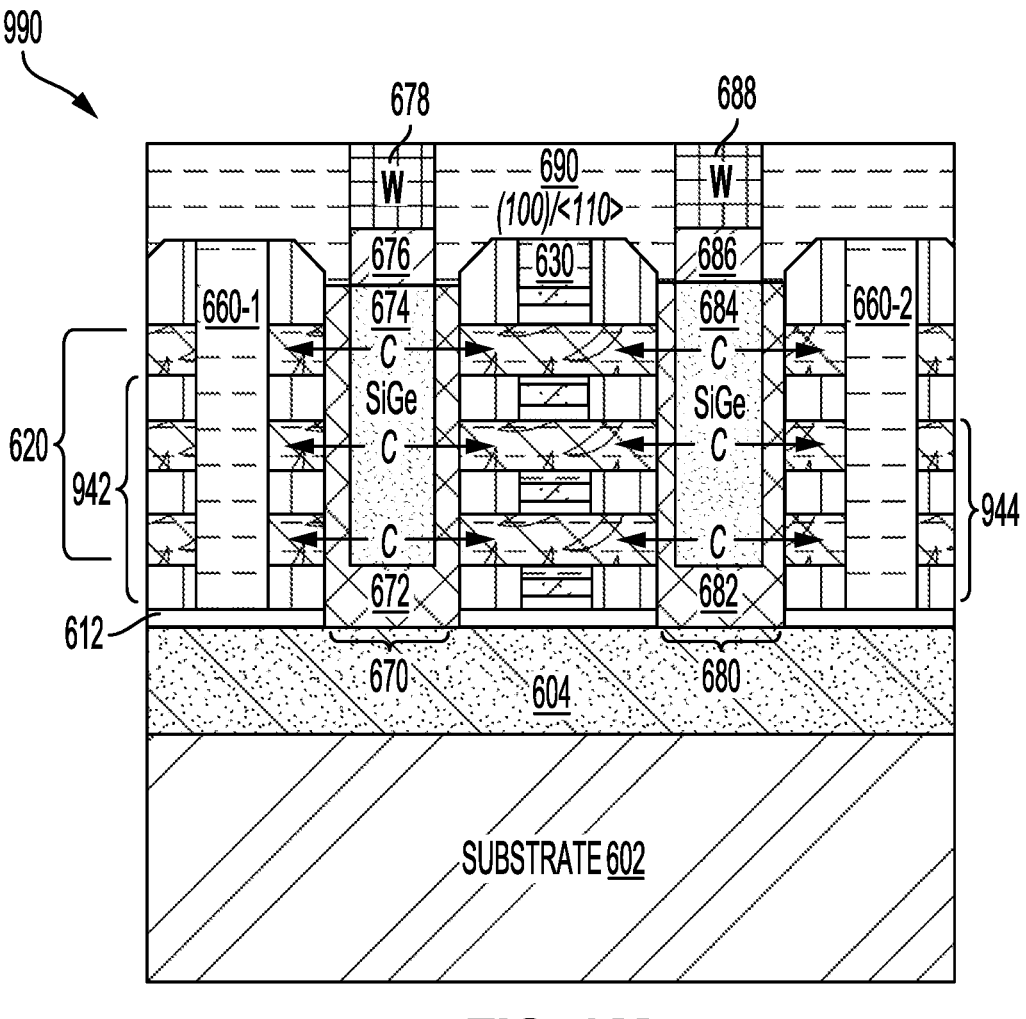

FIG. 9M illustrates a last step 990 in the process of forming the GAA FET 600 having strained source and drain regions, according to various aspects of the present disclosure. At step 990, an interlayer dielectric (ILD) film oxide is deposited to reform the ILD oxide layer 690. Next zero vias (V0) are formed in the ILD oxide layer 690 to expose the MD contact 676 in the source/drain region 670 and the MD contact 686 in the drain/source region 680. Once formed, a conductive material is deposited in the V0 opening to form a V0 contact (e.g., the source/drain contact 678) to the MD contact 676 in the source/drain region 670, and a V0 contact (e.g., the drain/source contact 688) to the MD contact 686 in the drain/source region 680. This process is completed by performing a CMP process on the source/drain contact 678 and the drain/source contact 688.

FIG. 10 is a process flow diagram illustrating a method 1000 for fabricating a gate all around (GAA) field effect transistor (FET) having strained source and drain regions, according to aspects of the present disclosure. The method 1000 begins at block 1002, in which a first trench in a first vertical structure having a source/drain region and a second trench in a second vertical structure having drain/source region of the FET are etched to expose a substrate. For example, FIG. 8D illustrates the next step 830, in which the nanosheet source/drain region cut forms a source/drain trench 641 (e.g., a first trench) and a drain/source trench 651 (e.g., a second trench). As shown in FIG. 9D, at step 930, the nanosheet source/drain region cut is performed. In this example, the nanosheet source/drain region cut forms a source/drain trench 671 and a drain/source trench 681.

At block 1004, the first trench is filled with a first stressor material. For example, FIG. 8F illustrates the next step 850 in the process of forming the GAA FET having strained source and drain regions, according to various aspects of the present disclosure. At step 850, an N+ tensile stressor material (e.g., embedded silicon (eSi)) is epitaxially grown on the semiconductor base layer 604 to fill the source/drain trench 641 with a tensile stressor material 852 and the drain/source trench 651 with a tensile stressor material 854.

At block 1006, the second trench is filled with a second stressor material different from the first stressor material. For example, FIG. 9F illustrates the next step 950 in the process of forming the GAA FET 600 having strained source and drain regions, according to various aspects of the present disclosure. At step 950, the P+ compress stressor material (e.g., embedded silicon germanium (eSiGe)) is epitaxially grown on the semiconductor base layer 604 to fill the source/drain trench 671 with a compress stressor material 952 and the drain/source trench 681 with a compress stressor material 954.

At block 1008, a metal gate is formed on the first vertical structure and on the second vertical structure. For example, at step 880, the dummy gate 812-2 is removed, as well as the dummy semiconductor layers (605, 607, and 609) shown in FIG. 8J. Once removed, a replacement metal gate (RMG) process is performed to form the metal gate 630. Step 880 is completed by performing a CMP process on the metal gate 630. As shown in FIG. 9K, at step 980, the dummy gate 912-2 is removed, as well as dummy semiconductor layers (605, 607, and 609) shown in FIG. 9J. Once removed, a replacement metal gate (RMG) process forms the metal gate 630. Step 980 is completed by performing a CMP process on the metal gate 630.

Figure 11:
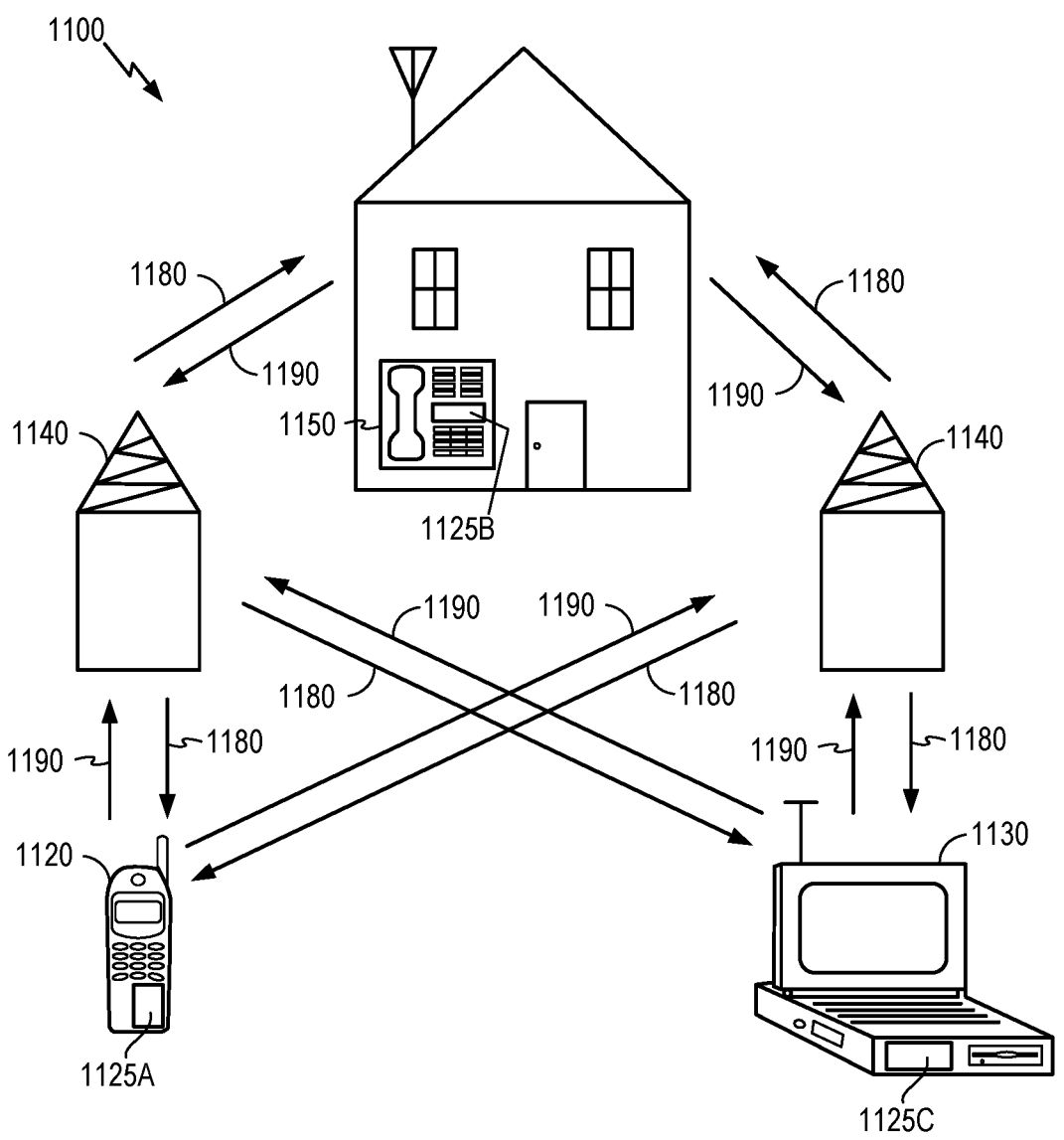
FIG. 11 is a block diagram showing an exemplary wireless communications system in which an aspect of the disclosure may be advantageously employed.

FIG. 11 is a block diagram showing an exemplary wireless communications system 1100 in which an aspect of the disclosure may be advantageously employed. For purposes of illustration, FIG. 11 shows three remote units 1120, 1130, and 1150, and two base stations 1140. It will be recognized that wireless communications systems may have many more remote units and base stations. Remote units 1120, 1130, and 1150 include IC devices 1125A, 1125C, and 1125B that include the disclosed GAA FETs. It will be recognized that other devices may also include the disclosed GAA FETs, such as the base stations, switching devices, and network equipment. FIG. 11 shows forward link signals 1180 from the base station 1140 to the remote units 1120, 1130, and 1150, and reverse link signals 1190 from the remote units 1120, 1130, and 1150 to base station 1140.

In FIG. 11, remote unit 1120 is shown as a mobile telephone, remote unit 1130 is shown as a portable computer, and remote unit 1150 is shown as a fixed location remote unit in a wireless local loop system. For example, the remote units may be a mobile phone, a hand-held personal communication systems (PCS) unit, a portable data unit such as a personal data assistant, a GPS enabled device, a navigation device, a set top box, a music player, a video player, an entertainment unit, a fixed location data unit such as meter reading equipment, or other devices that store or retrieve data or computer instructions, or combinations thereof. Although FIG. 11 illustrates remote units according to the aspects of the disclosure, the disclosure is not limited to these exemplary illustrated units. Aspects of the disclosure may be suitably employed in many devices, which include the disclosed GAA FETs.

Figure 12:
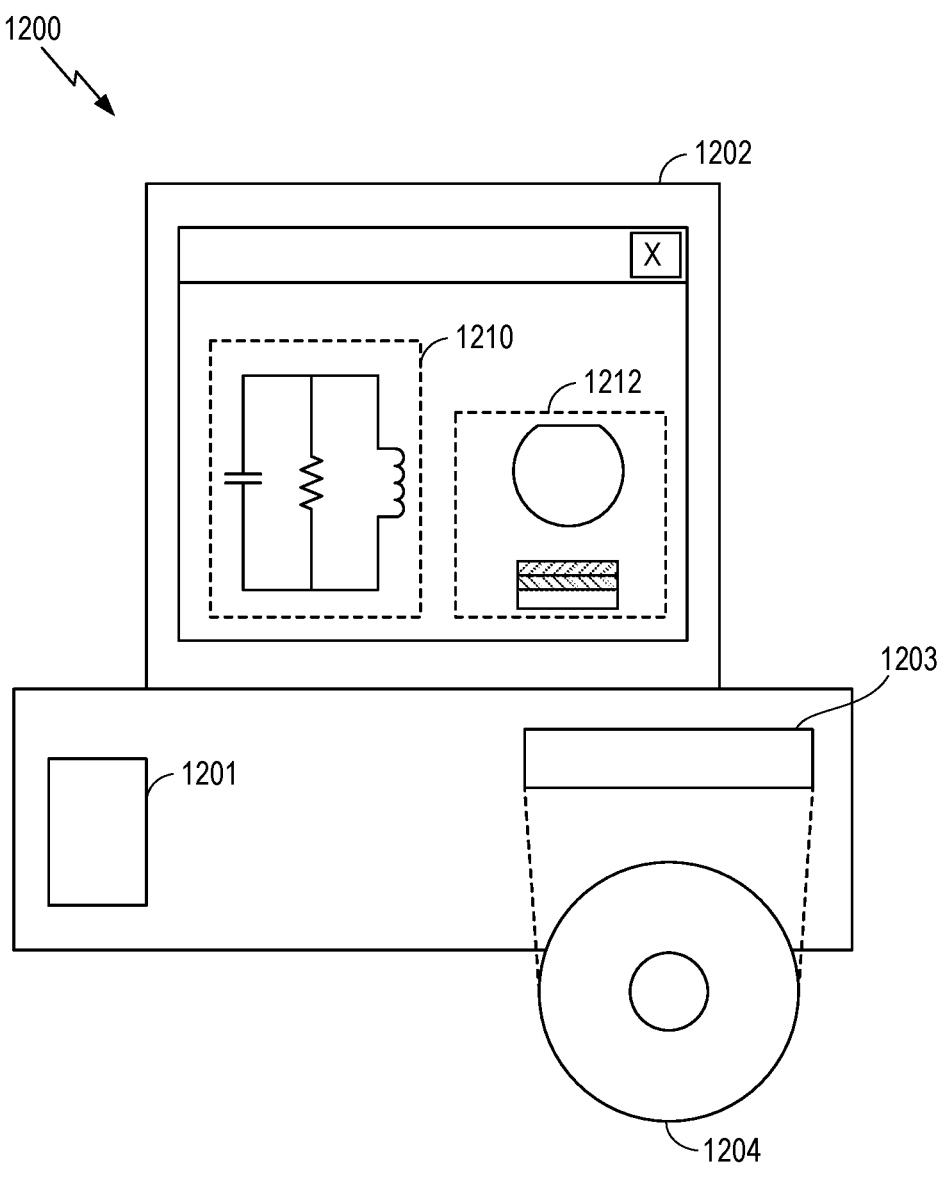
FIG. 12 is a block diagram illustrating a design workstation used for circuit, layout, and logic design of a transistor structure according to one configuration.

FIG. 12 is a block diagram illustrating a design workstation used for circuit, layout, and logic design of an IC structure, such as the FinFET disclosed above. A design workstation 1200 includes a hard disk 1201 containing operating system software, support files, and design software such as Cadence or OrCAD. The design workstation 1200 also includes a display 1202 to facilitate design of a circuit 1210 or a nanosheet structure 1212 including a GAA FET. A storage medium 1204 is provided for tangibly storing the design of the circuit 1210 or the nanosheet structure 1212. The design of the circuit 1210 or the nanosheet structure 1212 may be stored on the storage medium 1204 in a file format such as GDSII or GERBER. The storage medium 1204 may be a CD-ROM, DVD, hard disk, flash memory, or other appropriate device. Furthermore, the design workstation 1200 includes a drive apparatus 1203 for accepting input from or writing output to the storage medium 1204.

Data recorded on the storage medium 1204 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1204 facilitates the design of the circuit

1210 or the nanosheet structure 1212 by decreasing the number of processes for designing semiconductor wafers.

Implementation examples are described in the following numbered clauses:

1. A field effect transistor (FET), comprising:
   a substrate;
   a first vertical structure on the substrate and comprising a source/drain region having a first stressor material;
   a second vertical structure on the substrate and comprising a drain/source region having a second stressor material different from the first stressor material; and
   a metal gate on the first vertical structure and on the second vertical structure.

2. The FET of clause 1,
   in which the first vertical structure comprises a first nanosheet structure, including a first channel region, and the second vertical structure comprises a second nanosheet structure, including a second channel region; and
   in which the metal gate horizontally surrounds the first channel region and the second channel region on four sides.

3. The FET of clause 1 or 2, in which the first stressor material comprises a compressive strain direction and the second stressor material comprises a tensile strain direction.

4. The FET of any of clauses 1-3, in which the source/drain region comprises a stressor material spacer on a base and surrounding sidewalls of a contact trench.

5. The FET of clause 4, further comprising an inner contact plug in the contact trench and contacted to the contact trench through the stressor material spacer on the surrounding sidewalls and the base of the contact trench.

6. The FET of clause 5, further comprising a source/drain contact coupled to the inner contact plug.

7. The FET of any of clauses 1-3, in which the source/drain region comprises:
   a stressor material spacer on a base and surrounding sidewalls of a contact trench; and
   a stressor material plug in the contact trench and contacted to the contact trench through the stressor material spacer on the surrounding sidewalls and the base of the contact trench.

8. The FET of clause 7, further comprising:
   a metal to diffusion (MD) contact coupled to the stressor material plug; and
   a source/drain contact coupled to the MD contact.

9. The FET of any of clauses 1-18, in which the first vertical structure comprises:
   an N-type metal oxide semiconductor (NMOS) source region; and
   an NMOS drain region, in which the first stressor material comprises a tensile stressor material.

10. The FET of any of clauses 1-9, in which the second vertical structure comprises:
    a P-type metal oxide semiconductor (PMOS) source region; and
    a PMOS drain region, in which the second stressor material comprises a compressive stressor material.

11. A method fabricating a field effect transistor (FET) comprising:
    etching a first trench in a first vertical structure having a source/drain region and a second trench in a second vertical structure having drain/source region of the FET to expose a substrate;
    filling the first trench with a first stressor material;
    filling the second trench with a second stressor material different from the first stressor material; and forming a metal gate on the first vertical structure and on the second vertical structure.

12. The method of clause 11, in which the first vertical structure comprises a first nanosheet structure, including a first channel region, and the second vertical structure comprises a second nanosheet structure, including a second channel region; and in which the metal gate horizontally surrounds the first channel region and the second channel region on four sides.

13. The method of clause 11 or 12, in which the first stressor material comprises a compressive strain direction and the second stressor material comprises a tensile strain direction.

14. The method of any of clauses 11-13, in which the source/drain region comprises a stressor material spacer on a base and surrounding sidewalls of a contact trench.

15. The method of clause 14, further comprising forming an inner contact plug in the contact trench and contacted to the contact trench through the stressor material spacer on the surrounding sidewalls and the base of the contact trench.

16. The method of clause 15, further comprising forming a source/drain contact coupled to the inner contact plug.

17. The method of any of clauses 11-13, in which the source/drain region comprises:

a stressor material spacer on a base and surrounding sidewalls of a contact trench; and a stressor material plug in the contact trench and contacted to the contact trench through the stressor material spacer on the surrounding sidewalls and the base of the contact trench.

18. The method of clause 17, further comprising:

forming a metal to diffusion (MD) contact coupled to the stressor material plug; and forming a source/drain contact coupled to the MD contact.

19. The method of any of clauses 11-18, in which the first vertical structure comprises:

an N-type metal oxide semiconductor (NMOS) source region; and an NMOS drain region, in which the first stressor material comprises a tensile stressor material.

20. The method of any of clauses 11-19, in which the second vertical structure comprises:

a P-type metal oxide semiconductor (PMOS) source region; and a PMOS drain region, in which the second stressor material comprises a compressive stressor material.

For a firmware and/or software implementation, the methodologies may be implemented with modules (e.g., procedures, functions, and so on) that perform the functions described herein. Machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer. Disk and disc, as used herein, include compact disc (CD), laser disc, optical disc, digital versatile disc (DVD), floppy disk and Blu-ray® disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above, and below may refer to sides of a substrate or electronic device. Moreover, the scope of the present application is not intended to be limited to the particular configurations of the process, machine, manufacture, and composition of matter, means, methods, and steps described in the specification. As one of ordinary skill in the art will readily appreciate from the disclosure, processes, machines, manufacture, compositions of matter, means, methods, or steps, presently existing or later to be developed that perform the same function or achieve the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general-purpose or special-purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), and Blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. A field effect transistor (FET), comprising:
a substrate;
a first vertical structure on the substrate and having a source/drain region, comprising:
 a contact trench, including a spacer of a first stressor material on a base and surrounding sidewalls of the contact trench,
 a plug of the first stressor material in the contact trench and contacted to the contact trench through the spacer,
 a metal to diffusion (MD) contact coupled to the plug, and
 a source/drain contact coupled to the MD contact;
a second vertical structure on the substrate and comprising a drain/source region having a second stressor material different from the first stressor material; and
a metal gate on the first vertical structure and on the second vertical structure.

2. The FET of claim 1,
in which the first vertical structure comprises a first nanosheet structure, including a first channel region, and the second vertical structure comprises a second nanosheet structure, including a second channel region; and
in which the metal gate horizontally surrounds the first channel region and the second channel region on four sides.

3. The FET of claim 1, in which the first stressor material comprises a compressive strain direction and the second stressor material comprises a tensile strain direction.

4. The FET of claim 1, further comprising an inner contact plug in the contact trench and contacted to the contact trench through the spacer on the surrounding sidewalls and the base of the contact trench.

5. The FET of claim 4, in which the source/drain contact is coupled to the inner contact plug.

6. The FET of claim 1, in which the first vertical structure comprises:
an N-type metal oxide semiconductor (NMOS) source region; and
an NMOS drain region, in which the first stressor material comprises a tensile stressor material.

7. The FET of claim 1, in which the second vertical structure comprises:
a P-type metal oxide semiconductor (PMOS) source region; and
a PMOS drain region, in which the second stressor material comprises a compressive stressor material.

8. A method fabricating a field effect transistor (FET) comprising:
etching a first contact trench in a first vertical structure having a source/drain region and a second trench in a second vertical structure having a drain/source region of the FET to expose a substrate;
forming a spacer of a first stressor material on a base and surrounding sidewalls of the first contact trench;
forming a plug of the first stressor material in the first contact trench and contacted to the spacer on the surrounding sidewalls and the base of the first contact trench;
forming a metal to diffusion (MD) contact coupled to the plug;
forming a source/drain contact coupled to the MD contact;
filling the second trench with a second stressor material different from the first stressor material; and forming a metal gate on the first vertical structure and on the second vertical structure.

9. The method of claim 8, in which the first vertical structure comprises a first nanosheet structure, including a first channel region, and the second vertical structure comprises a second nanosheet structure, including a second channel region; and in which the metal gate horizontally surrounds the first channel region and the second channel region on four sides.

10. The method of claim 8, in which the first stressor material comprises a compressive strain direction and the second stressor material comprises a tensile strain direction.

11. The method of claim 8, further comprising forming an inner contact plug in the contact trench and contacted to the contact trench through the spacer on the surrounding sidewalls and the base of the contact trench.

12. The method of claim 11, in which the source/drain contact is coupled to the inner contact plug.

13. The method of claim 8, in which the first vertical structure comprises:

an N-type metal oxide semiconductor (NMOS) source region; and an NMOS drain region, in which the first stressor material comprises a tensile stressor material.

14. The method of claim 8, in which the second vertical structure comprises:

a P-type metal oxide semiconductor (PMOS) source region; and a PMOS drain region, in which the second stressor material comprises a compressive stressor material.

* * * * *